United States Patent [19]
Lin et al.

[11] Patent Number: 5,242,505
[45] Date of Patent: Sep. 7, 1993

[54] AMORPHOUS SILICON-BASED PHOTOVOLTAIC SEMICONDUCTOR MATERIALS FREE FROM STAEBLER-WRONSKI EFFECTS

[75] Inventors: Guang H. Lin; Mu Z. He, both of Bryan, Tex.; Mridula Kapur, Tarragona, Spain; John O'M. Bockris, College Station, Tex.

[73] Assignee: Electric Power Research Institute, Palo Alto, Calif.

[21] Appl. No.: 800,918

[22] Filed: Dec. 3, 1991

[51] Int. Cl.$^5$ ............ H01L 31/0376; H01L 31/0392; H01L 31/075; H01L 31/0272
[52] U.S. Cl. .................... 136/258; 252/501.1; 252/62.3 V; 423/324; 423/508; 423/511; 427/574; 427/583; 427/588; 427/76; 437/4; 437/101; 437/106; 428/620; 428/428; 257/55; 257/56; 257/458
[58] Field of Search .......... 136/258 AM; 357/2, 30 J, 357/30 K, 59 C, 61; 252/501.1, 62.3 V; 427/39, 76, 574, 583, 588, 76; 437/4, 101, 106; 423/324, 344, 508-509, 511, 561.1; 428/620, 428; 257/55-56, 458

[56] References Cited

FOREIGN PATENT DOCUMENTS 56-1578  1/1981  Japan ........................... 136/258 AM
56-1579  1/1981  Japan ........................... 136/258 AM

OTHER PUBLICATIONS

E. Holzenkampfer et al, *Proceedings, 4th E. C. Photovoltaic Solar Energy Conference* (1982), pp. 778-782.
A. Morimoto et al, *Jap. J. Appl. Phys.*, vol. 26, pp. 22-27 (1987) (Jan.).
Staebler and Wronski, "Reversible Conductivity Changes in Discharge-Produced Amorphous Si," *Appl. Phys. Lett.* 4:292-294 (1977) (August).
Lin et al., "New Hydrogenated Amorphous Silicon Alloys," *Appl. Phys., Lett.* 57:300-301 (1990) (July).
Lin, et al., "Plasma-Enhanced Chemical Vapor Deposition of Amorphous Silicon-Selenium Alloy Films," *J. Non-Cryst. Solids* 127:186-190 (1991).
Lin et al., "The Electrical and Optical Properties of Amorphous Silicon Alloys by Plasma-Enhanced CVD Method," *Mat. Res. Soc. Symp. Proc.* 165:167-172 (1990).
He et al., "Amorphous Silicon Selenium Alloy Film Deposited Under Hydrogen Dilution," *Mat. Res. Soc. Symp. Proc.* 219:727-732. (1991).

*Primary Examiner*—Aaaron Weisstuch
*Attorney, Agent, or Firm*—Klarquist, Sparkman, Campbell, Leigh & Whinston

[57] ABSTRACT

Alloys of amorphous silicon with Group VIa elements are disclosed that form high-quality materials for photovoltaic cells that are resistant to Staebler-Wronski photodegradation. Also disclosed are methods for manufacturing the alloys. The alloys can be formed as films on solid-state substrates by reacting silane gas and at least one alloying gas ($H_2M$, wherein M is an element from Group VIa of the periodic table), preferably with hydrogen dilution, by a glow-discharge method such as plasma-enhanced chemical vapor deposition. The alloys can have an optical bandgap energy from about 1.0 eV to about 2.3 eV, as determined by selecting one or more different Group VIa elements for alloying or by changing the concentration(s) of the alloying element(s) in the alloy. The alloys exhibit excellent light-to-dark conductivity ratios, excellent structural quality, and resistance to Staebler-Wronski degradation. They can be used as "i" type or doped for use as "p" or "n" type materials.

27 Claims, 13 Drawing Sheets

▼ w/o $H_2$         ● with $H_2$

○ with $H_2$    ● w/o $H_2$    ▲ a-Si:H

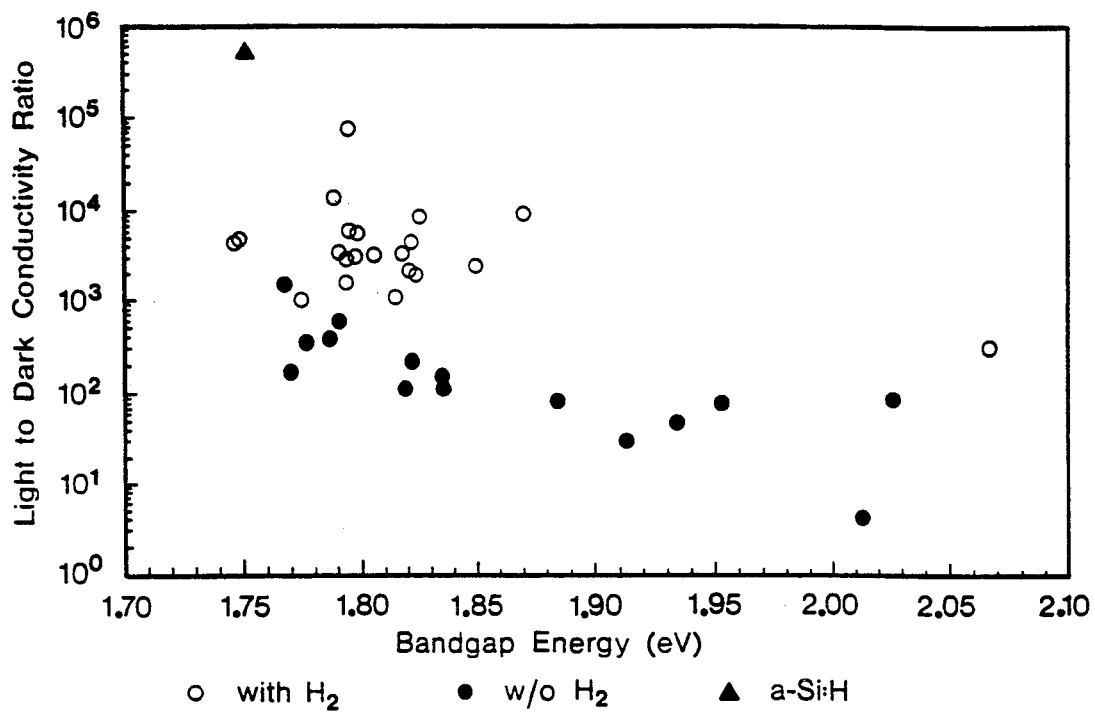

AMORPHOUS SILICON-BASED PHOTOVOLTAIC SEMICONDUCTOR MATERIALS FREE FROM STAEBLER-WRONSKI EFFECTS

BACKGROUND OF THE INVENTION

Photovoltaic cells, also termed "solar cells", are the subject of intensive technical development as a possible alternative to energy sources dependent upon fossil fuels. Solar cells have been used on a large scale by the U.S. space program for powering satellites and other devices used in space.

In the quest for economic mass production of solar cells, amorphous silicon has shown promise, particularly because this material is relatively abundant and appears to be amenable to continuous processes of production. For these and other reasons, amorphous silicon is currently the most common material used in photovoltaic devices.

Each atom of silicon has four outer-orbit or "valence" electrons which can form covalent bonds with adjacent silicon atoms. Atoms of most other elements have more or fewer than four valence electrons. These other elements, when considered relative to silicon, are termed electron "donors" and "acceptors", respectively. Small amounts of certain of these other elements can be controllably added to silicon in a process termed "doping" to form alloys that either have an excess of electrons or an excess of electron vacancies or "holes". A substance with excess electrons is termed an "n-type" material and a substance with excess holes is termed a "p-type" material. Holes act as positive-charge current carriers. When an n-type and a p-type material are joined, a "junction" characterized by a potential barrier is formed at the interface.

The photovoltaic effect results in the generation of electric power when certain materials absorb radiation such as light. If the radiation energy level is sufficient, separated pairs of electrons and holes are created, thereby creating electric power when the electrons and/or holes pass through a junction. The energy of each photon, however, must equal or exceed an energy "bandgap" existing between valence electrons and conduction electrons in order to produce the electron-hole pairs. This energy barrier is termed the "optical bandgap" $E_g$. Photons having an energy less than $E_g$ make no contribution to the cell output and are partially absorbed as heat. Photons with energy greater than $E_g$ contribute an energy $E_g$ to the cell output by creating an electron-hole pair. Any excess energy over $E_g$ is dissipated as heat. Semiconductors having optical bandgaps between about 1 and 2.3 eV can all be considered solar cell materials. Generally, a number of factors contribute to energy loss in the transformation of light energy to electrical energy in photovoltaic cells; the theoretical maximal efficiency of silicon solar cells is less than about twenty-five percent.

Amorphous silicon-based alloys have received considerable attention for use in photovoltaic devices. Amorphous silicon is particularly amenable to alloying and doping, thus permitting the material to be readily tailored to form both high and low optical bandgap semiconductors. A solar cell employing a single active semiconductor utilizes only a limited portion of the incident solar spectrum. Because excess photon energy is "wasted" as heat, it is of technological importance to find various semiconductor materials with optical bandgaps that differ over a wide range from that of amorphous silicon.

The most promising way of creating semiconductor materials having different optical bandgaps has been by alloying amorphous silicon (designated "a-Si") with various elements. Although amorphous silicon alloys have applications in a variety of devices, their main application remains in tandem photovoltaic cells. Lin et al., *Appl. Phys. Lett.* 55:386 (1989). To date, alloys of amorphous silicon have been prepared principally by adding Group IVa elements to the silicon, e.g., carbon, germanium, and tin. Girginoudi et al., *J. Appl. Phys.* 66:354 (1989). For photovoltaic applications, amorphous silicon and alloys thereof are typically "hydrogenated." For example, such alloys with Group IVa elements are designated "a-Si:C:H" for a hydrogenated amorphous silicon-carbon alloy, "a-Si:Ge:H" for a hydrogenated amorphous silicon-germanium alloy, and "a-Si:Sn:H" for a hydrogenated amorphous silicon-tin alloy. Hydrogenated amorphous silicon alloys have also been prepared that incorporate nitrogen, oxygen, and fluorine. Shufflebotham et al., *J. Noncryst. Solids* 92:183 (1987). Very few ternary alloys have been produced. The Group IVa elements have been favored candidates for alloying with silicon because these elements resemble silicon in chemical properties. Thus, many researchers expected these elements to "substitute" for silicon in the amorphous network, giving rise to defect-free alloys. However, it has been found that, particularly in the amorphous matrix, such factors as disorder-induced strain, preferential hydrogen bonding to certain elements, differences in atomic size, and other factors caused the silicon alloys formed with these elements to have unexpectedly disrupted structures. Morimoto et al., *Jpn. J. Appl. Phys.* 20:L833 (1981).

Certain hydrogenated alloys have been shown to produce "device-quality" alloys, particularly by the plasma-enhanced chemical vapor deposition (PECVD) method. (The term "device quality" has an unclear definition in the art. As used herein, "device quality" materials at least have a light-to-dark conductivity ratio of $10^4$ or greater and a photoconductivity of about $10^{-4}$ S/cm or greater. Other parameters such as defect-state density and Urbach tail energy are also often considered in the art in determinations of whether or not a material is of device quality.) The optical and electrical properties of amorphous silicon alloys can be further altered by "hydrogen dilution" wherein hydrogen gas is controllably incorporated into the amorphous alloy during formation of the alloy. Apparently, hydrogen ions produced in the plasma, having relatively light mass and high speed, effectively etch out weaker bonding on the growth surface of the alloy, thereby facilitating the formation of a denser alloy network. Hydrogen dilution is also believed to improve the alloys by terminating "dangling" bonds in the amorphous silicon atomic network.

A serious problem with many amorphous silicon solar cells is that their power output (i.e., their "conversion efficiency") will degrade when the cells are exposed to light. Staebler and Wronski, *Appl. Phys. Lett.* 31:292 (1977). This phenomenon, termed "Staebler-Wronski degradation", results in a considerable reduction in the initial device efficiency, wherein it will be reduced by a considerable amount (15 to 30 percent for a single-junction solar cell; 10 to 15 percent for a multijunction solar cell) when the device is subjected to operational illumination conditions. Thin, multijunction, amorphous silicon-alloy devices have demonstrated less light-induced degradation than single-junction devices of comparable initial efficiencies. However, further increases in stabilized efficiencies are needed.

Since Staebler-Wronski degradation represents a serious shortcoming, particularly of thin-film, amorphous silicon-based photovoltaic devices, much research effort is currently being dedicated to understanding and solving this problem. Degradation of the intrinsic layer ("i-layer") of solar cells having such a layer appears to be the most serious impediment to long-term cell performance. Light is the principal cause of this problem. Various models to "explain" Staebler-Wronski degradation have been proposed:

(a) Fracture of weak Si-Si or Si-H bonds by the energy released from nonradiative carrier (hole-electron) recombinations.

(b) Changes of charged states of dangling bonds due to interactions with photons.

(c) Changes in dopant coordination in alloys containing dopants due to interactions with photons.

All these models are believed to involve the presence of hydrogen in the material. That is, even though hydrogen imparts certain beneficial properties to an amorphous silicon alloy, such as a desirable change in optical bandgap, hydrogen may also contribute to the Staebler-Wronski effect. To date, however, the effect of hydrogen has been only theoretical; the mechanism by which hydrogen imparts this purported detrimental effect is unknown. In any event, research aimed at reducing the Staebler-Wronski effect has heretofore centered on decreasing the hydrogen content, principally by changing deposition methods and conditions. But, because hydrogen is necessary for terminating dangling bonds, hydrogen cannot be decreased without reducing the quality of the amorphous material. Thus, this research has had limited success in yielding amorphous silicon-based semiconductor material that is both high quality and free of the Staebler-Wronski effect.

Thus, there is a need for "device quality" amorphous silicon-based materials that do not exhibit the Staebler-Wronski effect.

SUMMARY OF THE INVENTION

Alloys of amorphous silicon with elements in Group VIa of the periodic table form high-quality photovoltaic cell materials that are resistant to Staebler-Wronski photodegradation. Although the preferred Group VIa elements are selenium and sulfur, other Group VIa elements can also be used. The alloys are formed preferably by reacting silane gas, hydrogen gas, and at least one Group VIa alloying gas ($H_2M$, wherein M is an element from Group VIa) at a temperature and subatmospheric pressure at which the reactive gases react to form an amorphous alloy of silicon, hydrogen, and the Group VI element. Typically, the alloys are formed as films on solid-state substrates.

Alloys according to the present invention are preferably formed via plasma-enhanced chemical vapor deposition (PECVD). The plasma facilitates formation of the alloys at temperatures much lower than would be required in the absence of a plasma. The amount of alloying element incorporated into the amorphous silicon during formation of the alloy is determined by adjusting the flow rate of the alloying gas relative to the flow rate of silane into the PECVD reactor. Other conventional methods can also be used to produce the alloys including, but not limited to, dc glow-discharge deposition, hot-wire deposition, and sputtering.

Substrates on which the amorphous silicon alloys can be formed comprise materials that are solid-state at reaction temperature and unreactive with silane under alloying reaction conditions. Representative substrates include, but are not limited to, certain polymeric (plastic) materials, glass, quartz, titanium, stainless steel, and crystalline silicon.

Alloys according to the present invention have semiconductor properties and have optical bandgap energies permitting their use in photovoltaic cells. Typical optical bandgaps are within the range of 1.0 eV to 2.3 eV. The exact value of the optical bandgap energy can be altered by using a different alloying element or changing the concentration of the alloying element in the alloy. The alloys also have excellent light-to-dark conductivity ratios, generally within the range of $10^2$ to $10^4$, or greater, as well as excellent structural quality. Finally, and most importantly, the alloys are resistant to Staebler-Wronski degradation. Preferably, the alloys are prepared with hydrogen dilution, which, we have found, improves their resistance to Staebler-Wronski degradation and substantially improves the optical and electrical properties of the alloy.

The alloys can be doped using any of the techniques presently employed for doping silicon so as to form "n" materials or a "p" materials. Alternatively, the alloys can be used as intrinsic "i" semiconductors.

Generally, the amount of alloying element in the amorphous silicon alloy according to the present invention ranges from greater than zero to about 30 at. %. However, no practical upper limit to the amount of alloying element in the alloy is known.

Alloys according to the present invention have particular utility for use in manufacturing photovoltaic cells, which can have single or multiple junctions. Thus, the scope of the present invention encompasses photovoltaic cells comprised of an alloy having any of various combinations of the foregoing properties.

The present invention also encompasses methods for producing solid-state alloys having any of the foregoing properties, as well as products prepared using said methods.

BRIEF DESCRIPTION OF THE DRAWINGS

FIG. 14 comprises plots of the light-to-dark conductivity ratio as a function of optical bandgap energy for amorphous silicon-sulfur alloys, deposited with and without hydrogen dilution, according to the present invention.

FIG. 15 comprises plots of the light-to-dark conductivity ratio as a function of film deposition rate for amorphous silicon-sulfur alloys, deposited with and without hydrogen dilution, according to the present invention.

DETAILED DESCRIPTION

We unexpectedly discovered that alloys of amorphous silicon with Group VIa elements formed high quality photovoltaic cell materials that did not exhibit the Staebler-Wronski effect. For example, we produced, with hydrogen dilution, amorphous silicon alloys with selenium and sulfur that were resistant to Staebler-Wronski degradation. We first selected selenium as a candidate alloying element because the bond lengths and bond strengths of selenium and silicon are similar. (The lengths of both Si—Si and Se—Se bonds are 1.17 Å. The corresponding bond strengths are $E_{Si-Si}=78.1$ kcal/mol and $E_{Se-Se}=79.5$ kcal/mol.) The choice of selenium was particularly advantageous because the alloying reagent (i.e., $H_2Se$) is available as a gas which is required for the preferred method of preparing such alloys: plasma-enhanced chemical vapor deposition (PECVD). Likewise, the alloying component for making a silicon-sulfur alloy is available as a gas ($H_2S$), and the alloying component for making a silicon-tellurium alloy is available as a gas ($H_2Te$). These alloying-component gases an be generally represented as $H_2M$ wherein M is an element from Group VIa of the periodic table.

Higher-order alloys are also within the scope of the present invention, including alloys containing more than one Group VIa alloying element and alloys containing at least one Group VIa alloying element and another alloying element such as germanium, carbon, or nitrogen.

As stated above, the preferred method for producing alloys according to the present invention is PECVD. A plasma permits the amorphous silicon alloys to be formed at substantially lower temperatures than other methods not involving a plasma. It will be appreciated by persons skilled in the art that other methods for preparing amorphous silicon alloys can also be employed including, but not limited to, dc glow-discharge deposition, hot-wire deposition and sputtering methods. Virtually any method allowing alloying elements to be added to silicon so as to form a solid-state amorphous silicon alloy can be employed.

To prepare amorphous silicon alloys according to the present invention, we employed a capacitively coupled parallel-plate PECVD reactor. Using our PECVD reactor, we prepared the alloys as films deposited on various solid-state substrates.

Figure 1:
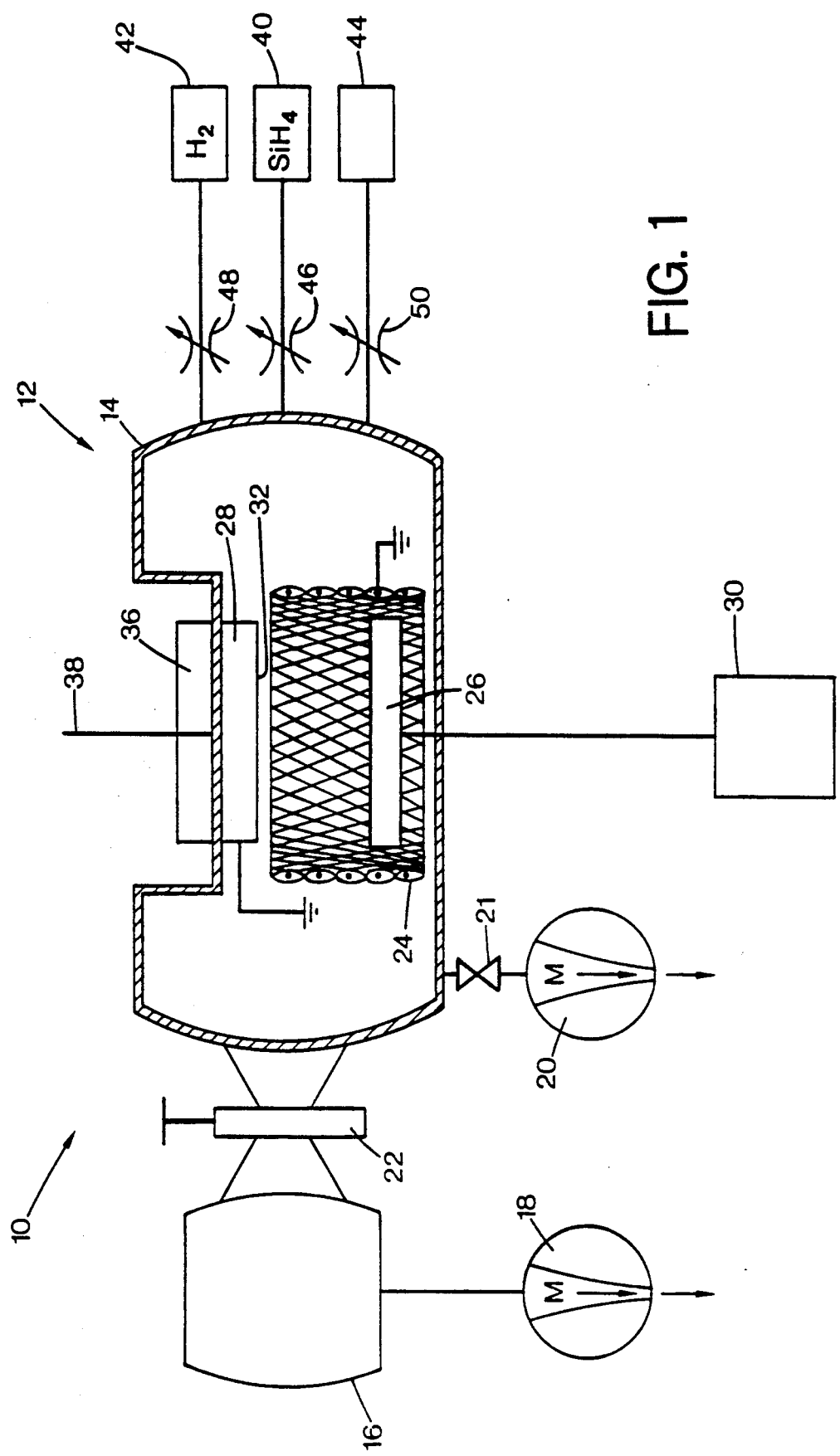
FIG. 1 schematically illustrates a capacitively-coupled rf plasma reactor suitable for making alloys according to the present invention via plasma-enhanced chemical vapor deposition.

FIG. 1 is a general schematic diagram of the PECVD reactor together with peripheral components. The reactor 10 comprises a reaction chamber 12 defined by a housing 14 capable of withstanding internal subatmospheric pressures ("vacuum" levels) of at least $10^{-7}$ Torr. Suitable housing materials are non-porous materials that do not react with silane, such as glass, quartz, or stainless steel. Stainless steel is preferred for larger housings due to its greater strength than glass or quartz. Stainless-steel housings can be equipped with glass or quartz viewing windows as required. The reaction chamber 12 is flanked by a conventional load-lock chamber 16 which is used as an antechamber for loading substrates into the reaction chamber 12. The load-lock chamber 16 and the reaction chamber 12 are evacuated independently by individual vacuum pumps. In a laboratory-size reactor 10, the vacuum pumps are typically turbomolecular pumps 18, 20 as shown schematically in FIG. 1. Larger reactors may require additional pumping capacity, such as by employing a roots-type pump instead of a turbomolecular pump or by employing a roots pump in series with a rotary vane or other type of vacuum pump. The reaction chamber 12 is kept constantly evacuated by the turbomolecular pump 20. Separating the reaction chamber 12 from the load-lock chamber 16 is a gate valve 22. To load a substrate into the reaction chamber 12, the substrate is first placed in a conventional substrate holder (not shown) in the load-lock chamber 16 under atmospheric pressure. Then, the load-lock chamber is evacuated using the turbomolecular pumps 18. The gate valve 22 is opened, and the holder and substrate are transferred from the load-lock chamber 16 to the reaction chamber 12 under vacuum. Transfer of the substrate holder (with substrate) is performed using a conventional feed-through rod or analogous appliance (not shown).

The reaction chamber 12 is particularly adapted for PECVD. The center of the reaction chamber 12 is effectively surrounded by a grounded mesh 24 made from a conductive material such as stainless steel. The mesh 24 surrounds a first rf (radio-frequency) electrode 26 and extends upward toward a second rf electrode 28. Each rf electrode 26, 28 is typically circular. The first rf electrode 26 is electrically coupled to an rf power supply 30. The second rf electrode 28 is electrically grounded and separated a defined distance from the first rf electrode 26. In our laboratory-size reactor 10, each rf electrode 26, 28 was 4.5 cm in diameter and separated from each other by about 1.4 cm.

During operation, an rf plasma is generated under high vacuum by the rf electrodes 26, 28 in the space between the electrodes surrounded by the mesh 24. The mesh 24 functions as an electrostatic shield surrounding and confining the rf plasma. The substrate is attached to the bottom surface 32 of the second rf electrode 28 by coupling the substrate holder to said bottom surface. The substrate is heated to a desired reaction temperature by a circular disc heater 36 situated outside the reaction chamber 12. A thermocouple 38 is employed to measure the temperature of the substrate. The reaction chamber is supplied with reactive gases 40, 42, 44, namely semiconductor-grade silane ($SiH_4$), hydrogen ($H_2$), and an alloying gas such as, but not limited to, hydrogen selenide ($H_2Se$; 98% pure) or hydrogen sulfide ($H_2S$), depending upon the desired alloy. More than one alloying gas can be supplied. The flow rates of the reactive gases are each controlled by a flow controller, metering valve 46, 48, 50, or analogous device.

During operation, the flow rates of silane and hydrogen are maintained constant (at 20 sccm in our laboratory-size reactor). The flow rate of the alloying gas is adjusted in the range 0.5 to 10% (relative to silane), according to the desired alloy composition. By way of example, the flow rate of hydrogen selenide relative to silane is typically in the range 0.5 to 6%; the flow rate of hydrogen sulfide relative to silane is typically in the range 3 to 9%.

In a reactor sized for laboratory studies, the rf power supply operated at 13.6 megahertz (MHz). (Other frequencies would also work, but permissible frequencies are established in the U.S. by statute.) The typical rf power density between the electrodes was 0.10 $W/cm^2$. However, it will be appreciated that the rf power density can be increased, such as to 1 to 10 $W/cm^2$, in a larger-scale apparatus.

The temperature of the substrate during plasma-enhanced chemical vapor deposition ranged from 230° C. to 360° C., preferably 250–270° C. The subatmospheric pressure in the reaction chamber prior to film deposition (i.e., prior to turning on flow of reactive gases) was less than $10^{-7}$ Torr. (This pressure is referred to as the "base pressure".) However, in larger-scale reactors, the base pressure can be $10^{-5}$–$10^{-6}$ Torr since lower pressures (greater "vacuums") are more difficult to obtain in larger reaction chambers. During actual chemical vapor deposition, the pressure in the reaction chamber ranged from 600 mTorr to 1,800 mTorr (preferably 650 to 1,200 mTorr) under hydrogen dilution conditions, and 250 mTorr to 550 mTorr without hydrogen dilution. Typical rates at which amorphous silicon alloy films were deposited on the substrates ranged from 0.4 Å/sec to 10 Å/sec. Of course, the final thickness of a film depended upon deposition time. Representative film thicknesses, not intended to be limiting, were 50–250 Å if the alloy film was used as the "p" or "n" layer. Film thicknesses were typically 1,500 Å to 5,000 Å if used for the "i" (intrinsic) layer in a device. Greater film thicknesses are also possible, including films 3 to 5 μm thick.

Suitable substrates for film deposition include, but are not limited to, glass (such as Corning Type 7059, Corning, N.Y.), conducting glass, stainless steel, quartz, titanium, and crystalline silicon. In fact, virtually any solid-state substrate, including certain polymers (plastics), unreactive with the reactants and stable to the temperatures encountered in the reactor can be used. The substrate can also be flexible and/or provided as a continuous sheet or ribbon, such as aluminum or steel foil, or plastic. Glass works well for general optical and electrical studies of the films deposited thereon. Titanium is particularly suitable for determinations of chemical composition of the films; quartz for performing electron-spin resonance (ESR) studies of the films; and crystalline silicon for Fourier-Transform Infrared Spectroscopy (FTIR) studies of the films. In general, suitable substrates have the following characteristics:

(a) solid-state at reaction temperature;
(b) able to withstand a temperature greater than the reaction temperature; and
(c) unreactive with $SiH_4$ or other reactive gases at reaction temperature.

The above-described PECVD method and apparatus were used to prepare amorphous silicon alloys according to the present invention. These alloys were prepared as films deposited on selected substrates such as glass, conducting glass, stainless steel, quartz, crystalline silicon, or titanium. Alloys according to the present invention generally have most to all of the following characteristics:

(a) They comprise amorphous silicon and at least one alloying element from Group VIa of the periodic table.
(b) They have semiconductor properties and have an optical bandgap permitting their use in photovoltaic cells. The optical bandgap is generally within the range of 1.0 eV to 2.3 eV, and can be changed by using a different alloying element and/or changing the concentration of the alloying element in the alloy. Also, the width of the optical bandgap is generally proportional to the concentration of the alloying element in the alloy.
(c) They are sufficiently hydrogenated to achieve termination of dangling bonds in the alloy.

(d) They have excellent light-to-dark conductivity ratios (photoresponse characteristics) generally within a range of $10^2$ to $10^4$, or greater, and superior film quality compared to non-hydrogenated alloys.

(e) They are resistant to Staebler-Wronski degradation.

A probable reason why prior-art amorphous silicon materials exhibit Staebler-Wronski degradation is the relatively high hydrogen content in these materials (normally greater than ten percent). As stated previously, according to the teachings of the prior art, incorporating hydrogen in amorphous silicon materials is necessary because hydrogen widens the optical bandgap and terminates dangling bonds. However, hydrogen also apparently causes light-induced degradation. Thus, prior-art materials have a disadvantage wherein reducing hydrogen content to lessen Staebler-Wronski degradation necessarily lessens the quality of the materials for use in photovoltaic cells. The present invention overcomes this limitation by alloying amorphous silicon with another alloying element in addition to hydrogen. Thus, in amorphous silicon alloys according to the present invention, atoms of the alloying element actually replace hydrogen atoms in the material, particularly hydrogen atoms that would otherwise terminate dangling bonds. Thus, even though alloys according to the present invention are preferably made with hydrogen dilution, such alloys have a lower hydrogen content than prior-art materials, even than amorphous silicon. Consequently, they are apparently resistant to Staebler-Wronski degradation. In addition, alloys according to the present invention, particularly alloys made under hydrogen-rich conditions, are denser and have fewer structural defects than prior-art materials. They also have a low ratio of $SiH_2$ to $SiH$ bonds (less than ten percent).

The mechanism by which hydrogen in prior-art hydrogenated amorphous silicon materials "causes" Staebler-Wronski degradation is unclear. It is, of course, known that hydrogen atoms are the smallest known atoms. Based on our work evaluating alloys according to the present invention, we believe that, upon absorbing incident photons, hydrogen atoms, due to their extremely small size relative to silicon atoms, readily migrate in the amorphous silicon atomic network. In other words, certain hydrogen-silicon bonds are metastable during illumination of the amorphous silicon material. In alloys according to the present invention, atoms of the alloying element (e.g., selenium, sulfur, or other Group VIa element) replace atoms of hydrogen. The atoms of the alloying element, due to their much larger size than hydrogen, are much less capable than hydrogen of migrating in the alloy atomic network. Thus, amorphous silicon alloys according to the present invention are much more stable under illumination than prior-art materials.

Amorphous silicon alloys according to the present invention can be doped using any of the various existing methods for doping silicon. Thus, "n-doped" and "p-doped" amorphous silicon semiconductor materials can be readily made. Alternatively, amorphous silicon alloys according to the present invention can be used as intrinsic ("i") semiconductors.

Making photovoltaic cells from amorphous silicon alloys according to the present invention can be done via any of the various methods known in the art. The cells can be single- or multiple-junction; they can have one or more intrinsic layers. For example, a cell can have a "pin" structure comprised of a substrate, a "p-doped" layer superposed on the substrate, an intrinsic ("i") layer superposed on the p-doped layer, and an "n-doped" layer superposed on the intrinsic layer. The number of pin layers can be one or many. In addition, a cell can comprise plural junctions each having a different optical bandgap energy. In other words, the alloys according to the present invention can be used anywhere and in any manner for which existing amorphous silicon materials and their alloys are used.

In the following examples, we evaluated a number of characteristics of amorphous silicon alloys according to the present invention, particularly so as to compare their characteristics and behavior with prior-art amorphous silicon materials. The following analytical methods were employed for these evaluations.

Analytical Methods

Film thicknesses of alloys according to the present invention were determined using an Alpha step profilometer (Tencore Instruments, Model No. 10-00020) or by using an optical interference method. Optical absorption and transmission spectra of the alloy films were recorded using a double-beam Perkin-Elmer Model 3BUV-Vic Spectrophotometer. Film thickness d, refractive index $n(\lambda)$, and the Urbach tail energy $E_o$ were calculated from the transmission spectrum within the wavelength range of 500 to 900 nm. Optical bandgap energies $E_g$ of the alloys were determined from the corresponding absorption spectra using the standard Tauc-plot method in the strong absorption zone. Tauc et al., Phys. Status Solidi 15:627 (1966).

Co-planar aluminum contacts were vacuum-evaporated on the alloy films to make electrical contacts for light and dark conductivity measurements. The typical distance between the two contacts was 4.5 mm. The light conductivity was determined by illuminating the alloy films with white light having 100 mW/cm$^2$ intensity, as calibrated by a photometer (Spectra model 301) with suitable neutral-density filters. Prior to performing photoconductivity experiments, each alloy film was annealed at 200° C. for about 20 minutes in a dark vacuum chamber.

Elemental compositions of the alloy films were determined by energy-dispersive X-ray spectroscopy (EDS), electron microprobe analysis (EPMA), or by secondary-ion mass spectroscopy (SIMS). The EDS analyses were performed using a TN-2000 attachment on a JEOL JSM-3SCF scanning electron microscope. The EPMA studies were performed using a Cameca MBX instrument equipped with a wavelength dispersive spectrometer, at a typical electron beam energy of 10 keV. The results were quantified by comparison with suitable standards. The SIMS analyses were conducted using a Cameca IMS-3f instrument, operating in the ion-probe mode. Cs$^+$ primary ions with 14.5 keV energy were rastered over a sample area measuring 250 $\mu$m$\times$250 $\mu$m. The elemental compositions of the films were determined from the negative secondary ions collected from an analyzed area of 8 $\mu$m diameter positioned in the center of the rastered area.

The number density of dangling bonds in the alloy films (on quartz substrates) was estimated from electron-spin resonance (ESR) measurements. Alloy films prepared on quartz substrates were immersed in a magnetic field at the temperature of liquid nitrogen. The microwave frequency was adjusted to about 9 GHz so that the spin resonance signal of the alloy sample attained a maximal value. The ESR signal was obtained by scanning the magnetic field from 2900 G to 3700 G. The resulting signals were compared with that obtained, under identical experimental conditions, for a standard p-type single-crystal silicon cycle with a known total spin number. These comparisons did not take into account differences in dielectric properties of the films on quartz substrates and single-crystal silicon.

Sub-bandgap photoresponse spectra (SPRS) were measured at a wavelength ranging from 600 to 1500 nm. The alloy films were illuminated by monochromatic light from a 600 lines/mm grating. A long-pass optical filter was used to cut off any secondary harmonic oscillation generated by the grating. Wavelength scanning was controlled by a monochromator drive. Monochromatic light intensity was measured by a germanium photo-sensor having a known spectral response. The photo-current response spectrum of the alloy film was recorded by a Keithley electrometer and was normalized by total incident photon number flux.

FTIR spectroscopy was performed using a type FTS-40 Fourier Transform Infrared Spectrometer (Bio-Rad Laboratories, Inc.) in the wavenumber range of 1800–2300 $cm^{-1}$. The background transmittance spectrum (substrate only) was subtracted from the alloy film transmittance spectrum; both spectra were measured under the same conditions. The resulting transmittance data were used to obtain the hydrogen bond form and to calculate the hydrogen content in the alloy films.

In order to further illustrate the invention, the following examples are given.

EXAMPLE 1

Figure 2:
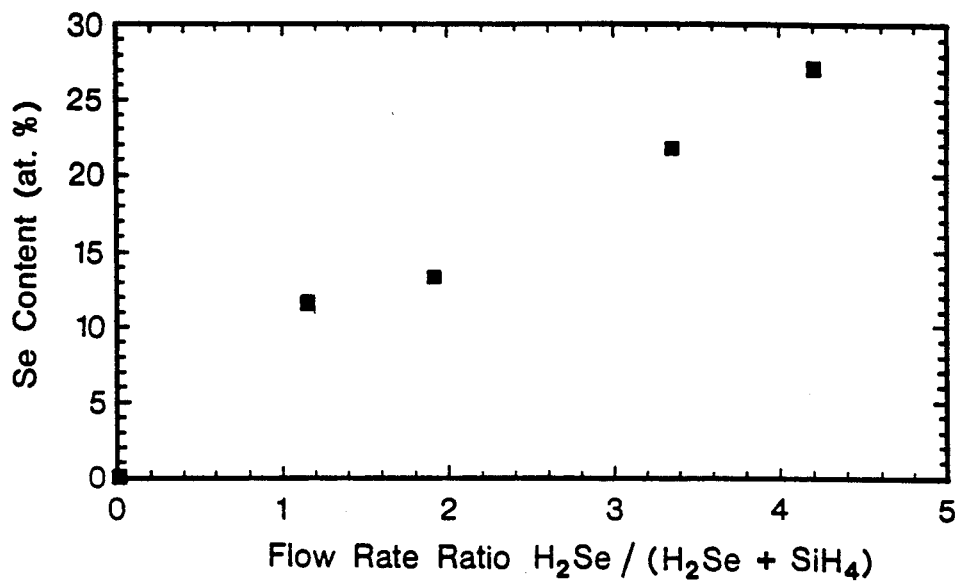
FIG. 2 is a plot, for alloys according to the present invention, of the concentration of selenium in the alloy versus the relative amount of hydrogen selenide gas flowing into the reactor of FIG. 1.

In this example, amorphous silicon-selenium alloy films were prepared having different selenium concentrations. After preparing the films, it was observed that the selenium concentrations in the films were much higher than what had been expected from the ratios of reactive gas flow rates. Nevertheless, as shown in FIG. 2, a substantially linear dependence of the selenium content upon the gas flow-rate ratio was obtained. For example, for films produced using a reactive gas flow-rate ratio ($H_2Se/(H_2Se+SiH_4)$) in the range of 1.2 to 4.2 percent, the corresponding selenium content in the film ranged from 11.6 to 27.1 at. %, respectively. (As used herein, "at. %" denotes atomic percent.)

The elemental compositions of the alloy films were determined using electron microprobe analysis (EPMA). The standard deviation in the EPMA results measured at different points on the alloy film surfaces was less than ±5%. This small variation indicates that the selenium was uniformly distributed throughout the film.

Figure 3:
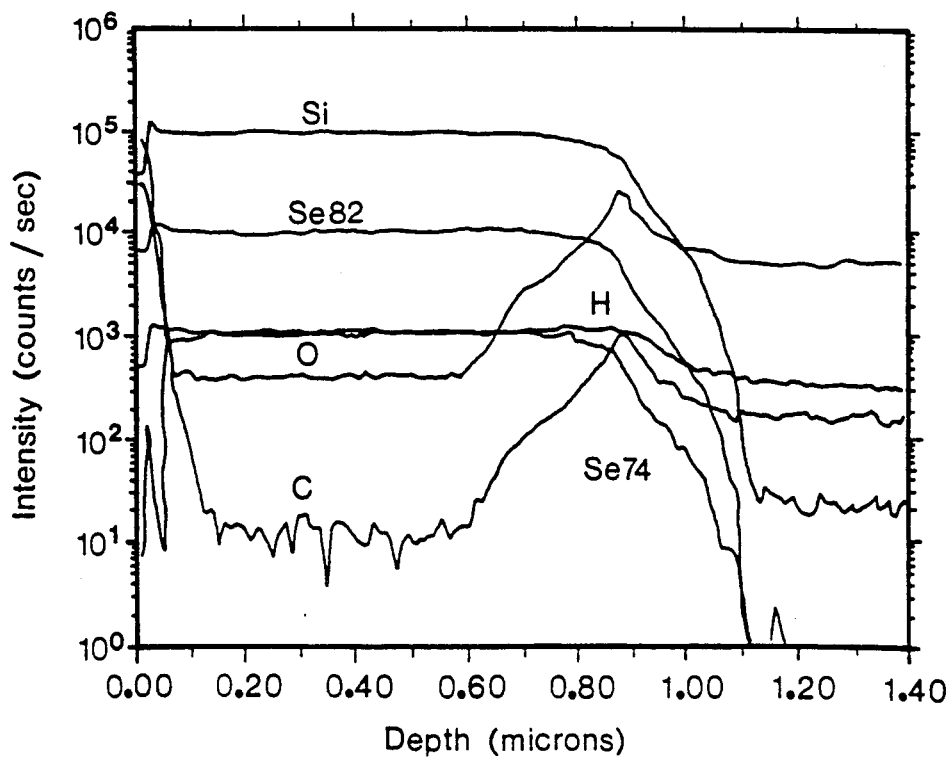
FIG. 3 is a depth profile of a hydrogenated amorphous silicon-selenium alloy according to the present invention as determined by secondary-ion mass spectroscopy.

The elemental depthwise distribution in the alloy films was measured by secondary ion-mass spectroscopy (SIMS) depth profile analysis. A typical SIMS spectrum is shown in FIG. 3, which indicates that the distribution of selenium and hydrogen was homogeneous. The SIMS spectra also showed that the films were relatively pure, containing only trace amounts (<0.4 at. %) of carbon and oxygen contaminants. As also shown in FIG. 3, two oxygen peaks were detected. The distance between the two peaks was substantially equal to the thickness of the same alloy film as determined using a profilometer. These thickness values varied less than 5% among all the films produced in this example. The first oxygen peak is believed to correspond to surface oxidation of the films upon exposure to air. The second oxygen peak, situated at the alloy-substrate interface, was attributed to surface oxidation of the titanium substrate.

Optical absorption spectra of the various amorphous silicon-selenium alloy films of this example were obtained in the 400 to 900 nm wavelength range. The absorption coefficient, $\alpha$, was calculated from absorbance and thickness data. Standard Tauc plots for the different a-Si:Se:H alloys were used to determine the optical bandgap, $E_g$. Selenium content, constant in each film, varied among the films within the range 0 to 30 at. %.

Figure 4:
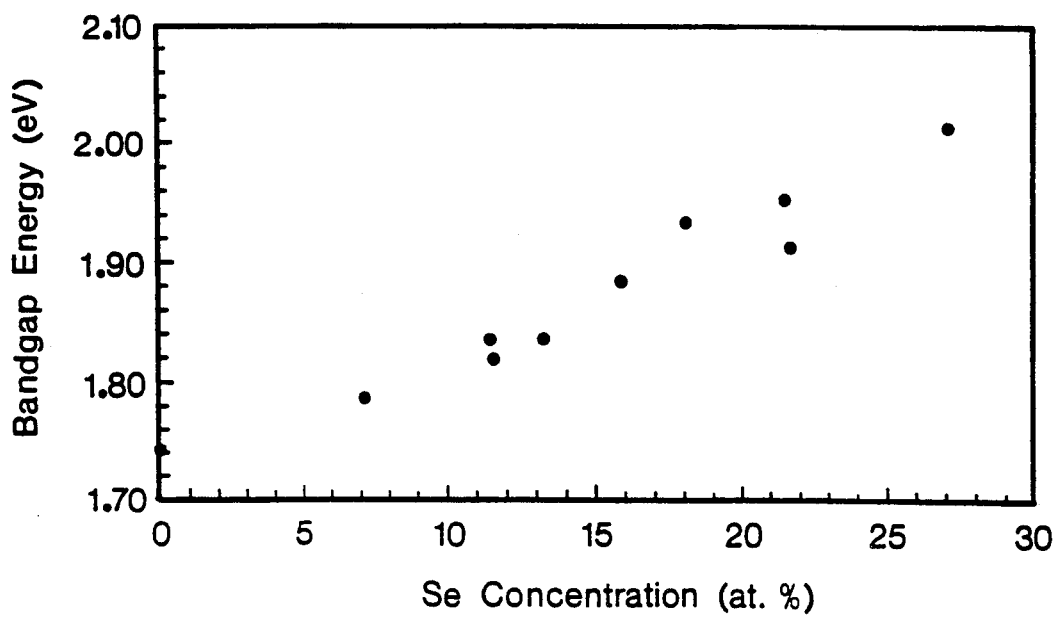
FIG. 4 shows optical bandgap energy increases with an increase in selenium concentration in alloys according to the present invention.

FIG. 4 shows the variation of optical bandgap energy as a function of composition for the a-Si:Se:H alloys. As can be seen, the bandgap energy increased from 1.74 eV for a pure a-Si:H film to 2.01 eV for a film containing 27.1 at. % selenium.

Figure 5:
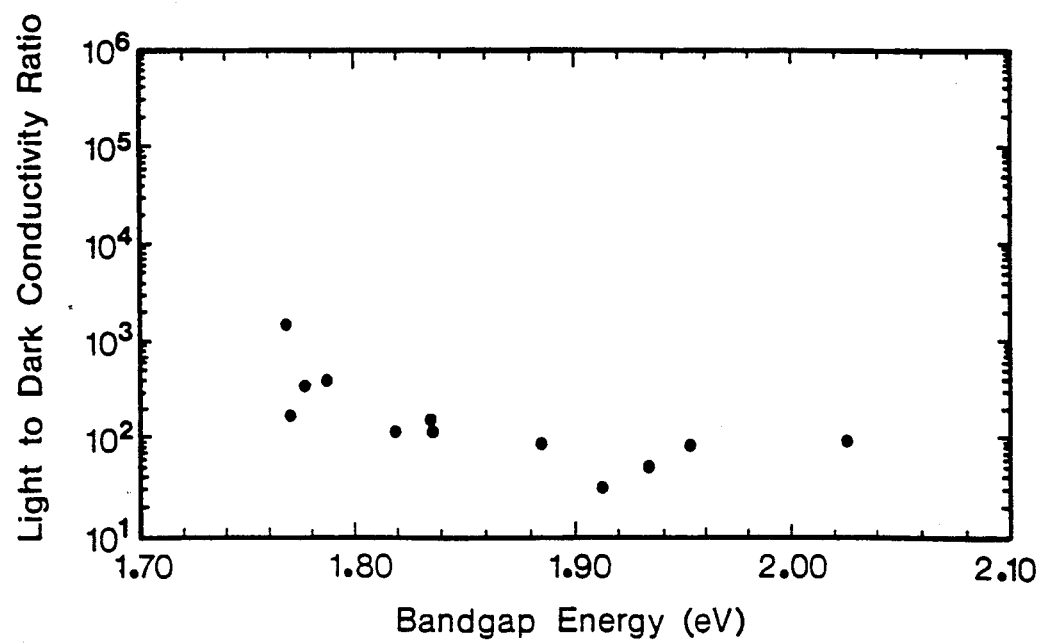
FIG. 5 shows, for hydrogenated amorphous silicon-selenium alloys according to the present invention, the dependence of the light-to-dark conductivity ratio on the optical bandgap energy of the alloy.

Photoresponse parameters (light-to-dark conductivity ratios) of the alloy films were measured under white-light illumination having an intensity of 100 $mW/cm^2$. The light-to-dark conductivity ratios for different Si-Se alloy compositions are shown in FIG. 5. The optical bandgap for a pure hydrogenated amorphous silicon film ($E_g$=1.74 eV) is also shown. Although the photoresponse values for the selenium alloy films were less than that of an a-Si:H film, certain excellent results were obtained. One film showed a light-to-dark conductivity ratio of at least three orders of magnitude.

The decrease in photoresponse with increasing selenium content is believed to be due to an increase of the density of defects in films having a higher selenium content. The number-density of dangling bonds, a measure of defect density, was estimated from ESR measurements of the films. Results are shown in Table I for certain a-Si:Se:H alloy films as well as a-Si:H films.

TABLE I

| Film | Dangling Bond Density ($cm^{-3}$) | Light-to-Dark Conductivity Ratio |
|---|---|---|
| a-Si:H | $6.7 \times 10^{16}$ | $3.3 \times 10^5$ |
| a-Si:H | $6.9 \times 10^{16}$ | $1.4 \times 10^3$ |
| a-Si:Se:H | $9.8 \times 10^{16}$ | $1.1 \times 10^3$ |
| a-Si:Se:H | $6.2 \times 10^{17}$ | $2.0 \times 10^2$ |

In table I, the relative error of the data was about ±6%. With respect to the film with poor photoresponse (light-to-dark conductivity ratio less than $10^3$), the low ratio was attributed to an increase in the number of dangling bonds in the film. However, with respect to the films having a light-to-dark conductivity ratio greater than $10^3$, the dangling-bond densities were close to the dangling bond density of amorphous silicon films. Thus, we concluded that the lower photoresponses of alloy films may have been caused by an increase of structural defects in the film resulting from incorporation of selenium. Nevertheless, these dangling-bond data indicated that the selenium atom may serve as a good terminator of dangling bonds.

EXAMPLE 2

In this example, the electrical and optical properties of various amorphous silicon-selenium alloy films were investigated. The films were prepared by PECVD with hydrogen dilution. The flow rate of hydrogen to silane was about 8:1 (108 standard cubic centimeters per minute (sccm) and 13.5 sccm, respectively). The gas flow rate of H₂Se to silane was adjusted within the range of 0.5 to 6%, according to the desired alloy composition.

Figure 6:
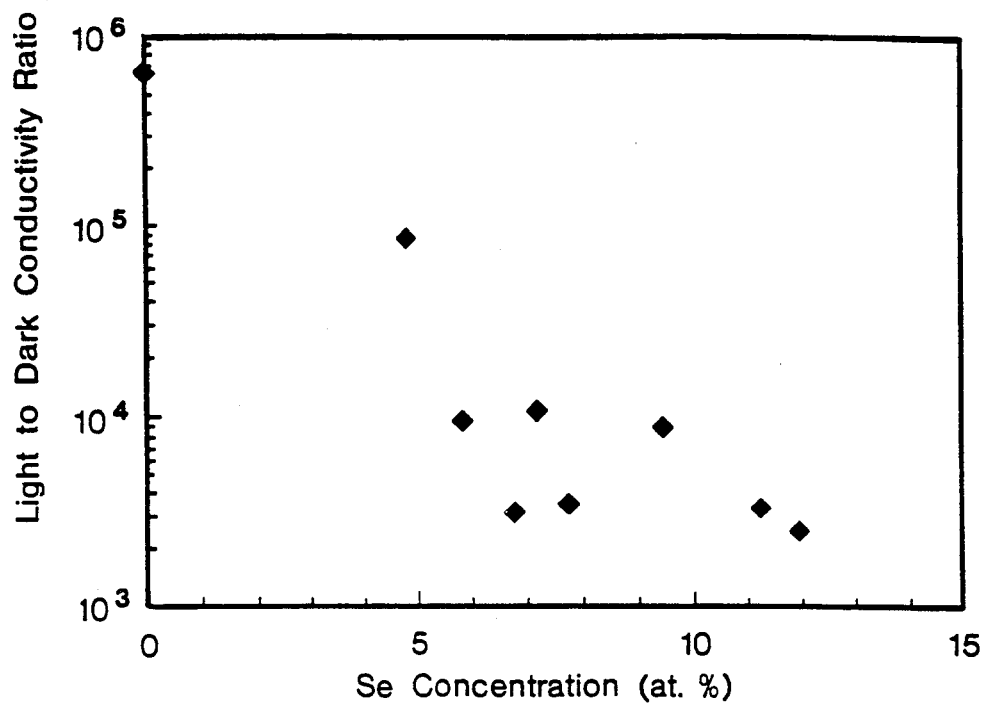
FIG. 6 shows the relationship of light-to-dark conductivity ratio to selenium concentration for amorphous silicon-selenium alloys deposited with hydrogen dilution according to the present invention.

The light-to-dark conductivity ratios (photoresponse values) for these films are shown in FIG. 6. The photoresponse value for pure amorphous silicon film (0 at. % Se) is also noted in the figure for comparison purposes. Changes in the magnitude of the light-to-dark conductivity ratio, ranging from $10^3$ to $10^5$, were observed, depending upon the selenium concentration. In general, the higher the amount of selenium in the alloy, the lower the photoresponse. The data in FIG. 6 indicated that these Si—Se alloys had excellent film quality.

Figure 7:
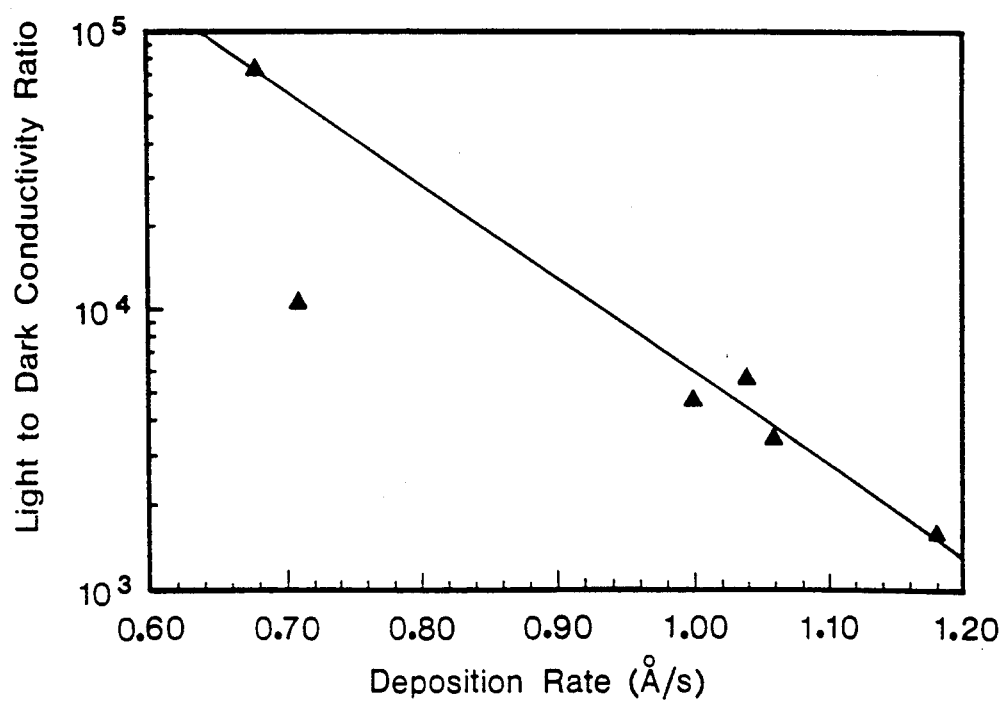
FIG. 7 shows the relationship of light-to-dark conductivity ratios of hydrogenated amorphous silicon-selenium alloys to the rates at which the alloys according to the present invention are prepared in a reactor as shown in FIG. 1.

We found that PECVD deposition rate is an important parameter which is directly related to film quality. FIG. 7 is a plot of light-to-dark conductivity ratio as a function of deposition rate. As the film-deposition rate increased, the light-to-dark conductivity ratio decreased. Thus, films having best quality were prepared at deposition rates around or less than 1 Å/s.

We also varied substrate temperature and gas pressure in the reaction chamber during the film depositions to as to optimize film quality. The optimum substrate temperature was around 340° C. The optimum gas pressure prior to rf discharge was 660 mTorr for producing selenium alloy films with hydrogen dilution.

Figure 8:
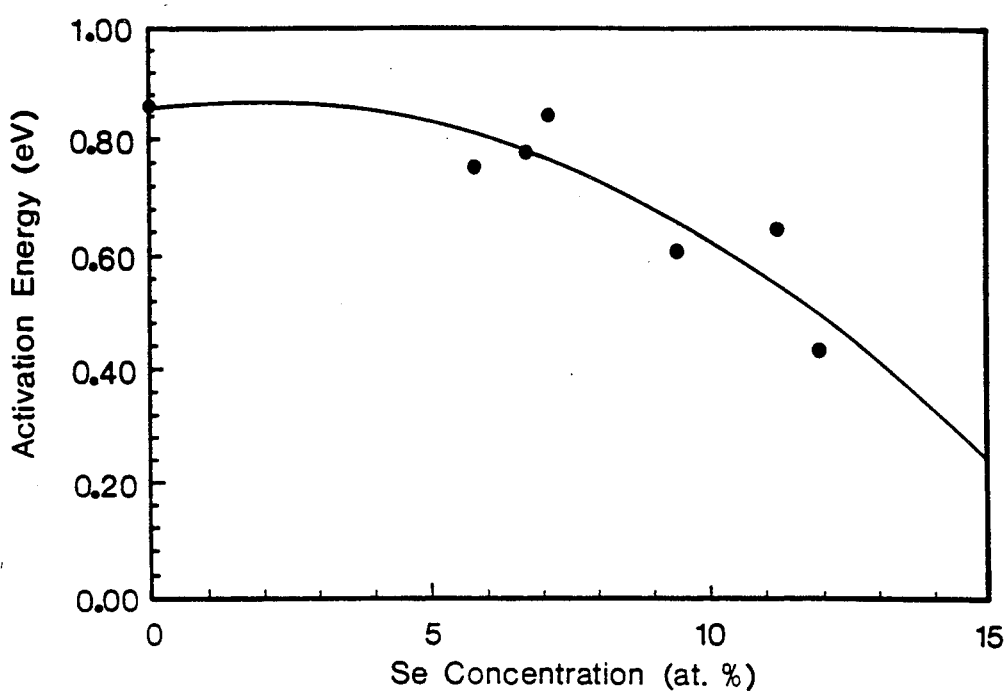
FIG. 8 illustrates the relationship of activation energy to selenium concentration in alloys according to the present invention.

Dark conductivity values for the various selenium alloy films were measured as a function of temperature T in a vacuum system, and plotted versus 1,000/T. The slope of the linear portion of each plot was used to calculate the thermal activation energy $E_A$ for the film. Activation energies plotted as a function of selenium concentration are shown in FIG. 8. In general, $E_A$ is about half the optical bandgap energy for amorphous silicon film. However, we found that $E_A$ decreased in the selenium alloy films as the selenium concentration increased. A possible explanation is that Si-Se alloys become more "n-type" as the selenium concentration in the alloy film increases.

Urbach-tail energies ($E_o$) were calculated from transmission spectra at the sub-bandgap region. Films with higher light-to-dark conductivity ratios had a lower Urbach-tail energy.

Figure 9:
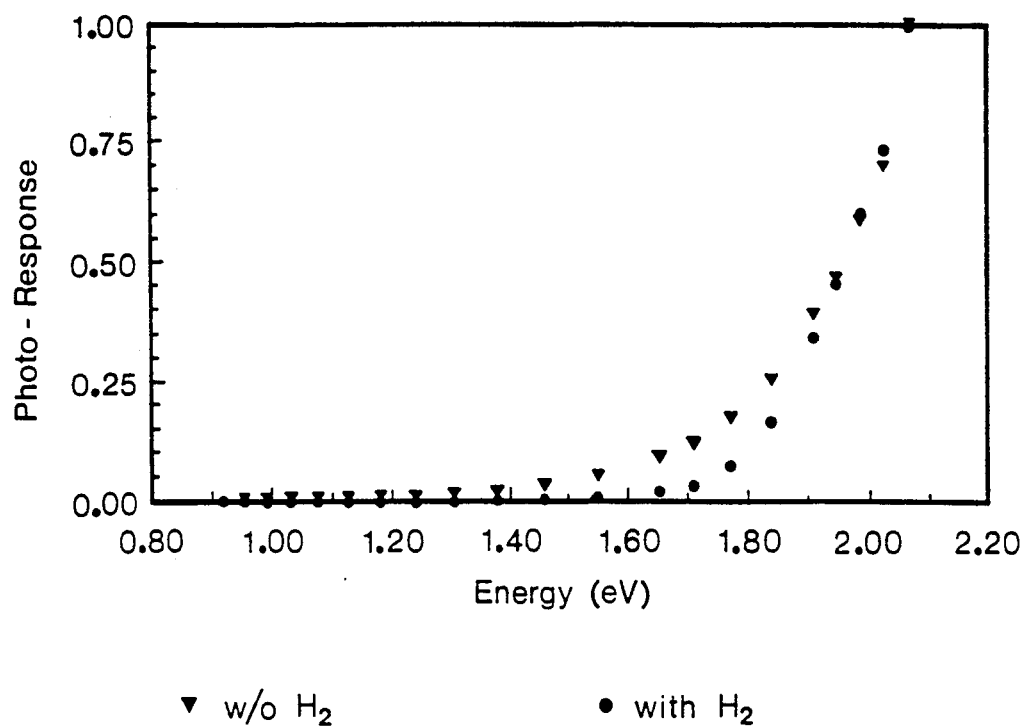
FIG. 9 is a sub-bandgap photoresponse spectrum of amorphous silicon-selenium alloys, deposited with and without hydrogen dilution, according to the present invention.

Sub-bandgap photoresponse spectra of selenium alloy films deposited with and without hydrogen dilution are shown in FIG. 9. Each spectrum consists of two sections, a linear portion and an exponential portion. The intersection of the linear portion with the energy axis (abscissa) corresponded to the optical energy bandgap. The two films were selected so that their bandgap energies were almost the same. The area covered by the exponential portion of the spectrum represents the structural defects. As shown in FIG. 9, films made with hydrogen dilution have a smaller exponential portion. Thus, the structural defects were reduced in selenium alloy films by depositing the alloys in a hydrogen environment. From these defect measurements, we believe that the reduction of photoresponse of the silicon-selenium alloy is mainly caused by an increase in the structural defects.

Figure 10:
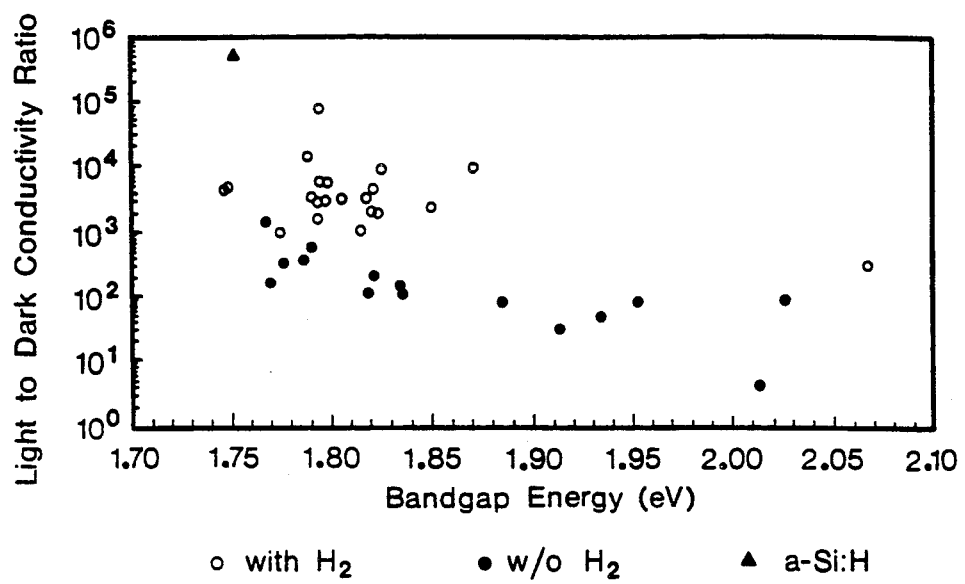
FIG. 10 comprises plots of the light-to-dark conductivity ratio as a function of bandgap energy for amorphous silicon-selenium alloys, deposited with and without hydrogen dilution, according to the present invention.

We also found that alloy film quality was improved by preparing them with hydrogen dilution, compared to selenium-alloy films deposited without hydrogen dilution. FIG. 10 shows light-to-dark conductivity ratios as a function of optical bandgap energies for both types of alloy films. The photoresponses of silicon-selenium alloys prepared with hydrogen dilution was, on the average, one order of magnitude higher than the photoresponses of similar alloys made without hydrogen dilution.

EXAMPLE 3

In this example, alloys of hydrogenated amorphous silicon with sulfur or selenium were prepared. The alloys were prepared using rf-glow discharge decomposition of a mixture of silane and alloying gas in a parallel-plate, capacitively coupled reactor as described hereinabove. The alloying gases used were hydrogen sulfide and hydrogen selenide. Various substrates were used, including Corning 7059 glass, quartz, titanium, and polished single-crystal silicon. Prior to film deposition, the reaction chamber was evacuated to a base pressure of $10^{-7}$ Torr. Typical deposition conditions were: reactant gas pressure: 500 to 700 mTorr; substrate temperature: 250 to 270° C.; and rf power density: 0.1 W/cm². Reactive gas flow rates were adjusted according to the desired alloy composition of the film. Film deposition rates were 1 to 2 Å/s.

Chemical compositions of alloy films were determined by the electron-probe microanalysis (EPMA) and secondary-ion mass spectroscopy (SIMS) techniques EPMA analysis performed at eight to ten random points on the film surfaces showed that the films were homogeneous in nature. The standard deviations in the elemental content of the films were typically less than ±0.5 at. %. The results of the SIMS depth-profile analysis indicated that hydrogen was uniformly distributed throughout the films. A slight decrease in the hydrogen content was observed with increasing concentration of sulfur in a-Si:S:H films.

In this example, optical-energy bandgaps ($E_g$) were determined from standard Tauc plots.

Figure 11:
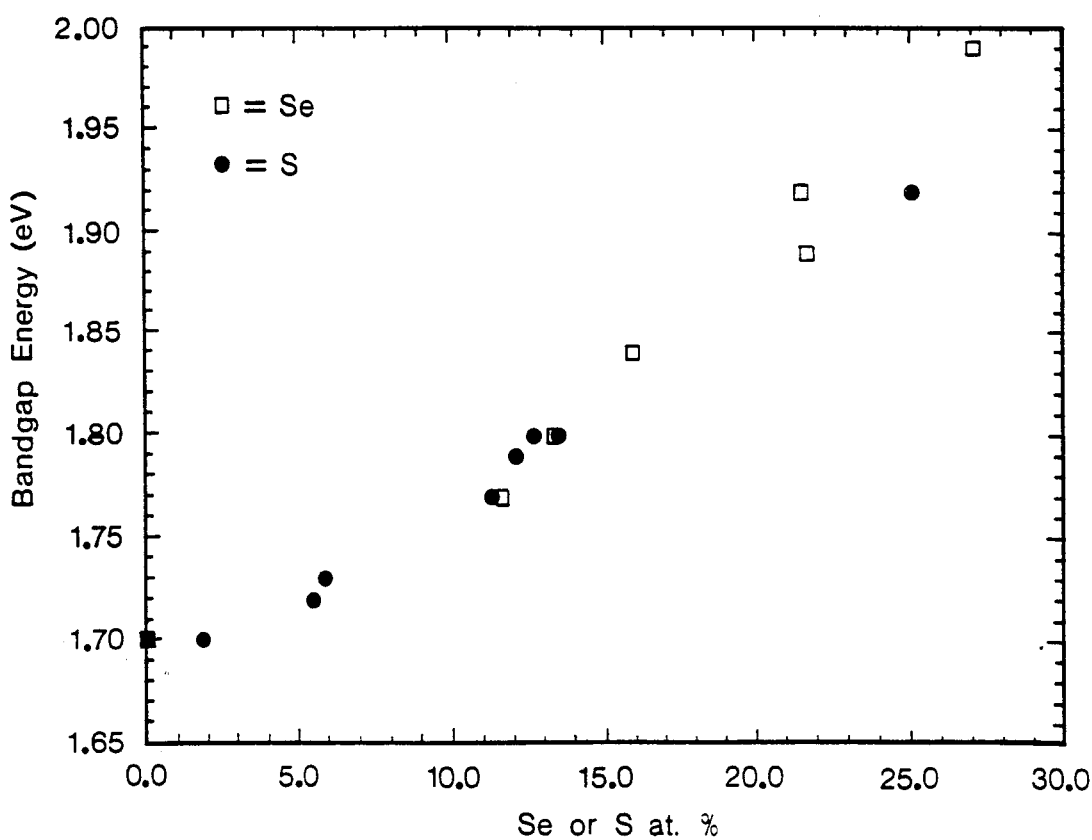
FIG. 11 shows the dependence of the optical bandgap energy, for high-bandgap silicon-sulfur and silicon-selenium alloys according to the present invention, on the concentration of the alloying element.

Alloying a-Si:H with sulfur or selenium yielded high bandgap materials, as shown in FIG. 11. An almost linear increase in the optical bandgap was obtained with increasing sulfur or selenium composition. The highest optical bandgap obtained for the sulfur alloys was 1.92 eV for a film containing 25.1 at. % sulfur. The optical bandgap of the selenium alloys ranged from 1.7 eV (Se=0 at. %) to 1.98 eV (Se=27.1 at. %).

The changes in the magnitude of the optical bandgap upon alloying different elements (M) with amorphous silicon can be related to the Si—M bond strength. Thus, alloys with Si—M bonds stronger than the Si—H bond (e.g., Si—S, Si—Se) can be expected to form higher optical bandgap alloys.

Photoresponses of the alloy films were determined by evaluating light-to-dark conductivity ratios ($\sigma_{light}/\sigma_{dark}$) of the films. Photoconductivity was determined by illuminating the film with white light at 100 mW/cm² intensity. The sulfur and selenium alloys showed the highest photoresponses. In particular, $\sigma_{light}/\sigma_{dark}$ values for an a-Si:Se:H film containing 4.0 at. % Se was $1.5 \times 10^3$ and for an a-Si:S:H alloy film containing 5.9 at. % sulfur was 400, as shown in Table II. For comparison, we prepared amorphous silicon alloys of aluminum and of gallium. The best of these alloys only exhibited a light-to-dark conductivity ratio of 10 (data not shown).

TABLE II

| Alloy | x (%) | $\sigma_{light}/\sigma_{dark}$ |
|---|---|---|
| a-Si:H | — | $5 \times 10^5$ |
| a-Si$_{1-x}$:Se$_x$:H | 4.0 | 1,500 |
| a-Si$_{1-x}$:Se$_x$:H | 7.5 | 390 |
| a-Si$_{1-x}$:Se$_x$:H | 11.5 | 150 |

TABLE II-continued

| Alloy | x (%) | $\sigma_{light}/\sigma_{dark}$ |
|---|---|---|
| a-Si$_{1-x}$:S$_x$:H | 5.9 | 400 |
| a-Si$_{1-x}$:S$_x$:H | 8.7 | 60 |
| a-Si$_{1-x}$:S$_x$:H | 12.7 | 25 |

We also performed a preliminary determination of the defect density in the a-Si:Se:H alloys by the electron spin resonance (ESR) technique. We found that, upon addition of 7 at. % Se to a-Si:H, the spin density increased from $6.7 \times 10^{16}$ to $6.0 \times 10^{17}$, corresponding to a relatively small increase in the number of dangling bonds upon the addition of selenium.

EXAMPLE 4

In this example, we prepared amorphous silicon-alloy films using the capacitively coupled, parallel-plate reactor as discussed hereinabove. The reactant gases were silane (semiconductor purity), hydrogen sulfide (99.99% pure), and hydrogen selenide (98.0% pure). The films were deposited on Corning 7059 glass, titanium, and polished single-crystal silicon substrates. Typical deposition conditions were as follows: base pressure prior to film deposition was $10^{-7}$ Torr; substrate temperature was in the range 250-270° C.; reactant gas pressure was between 500-700 mTorr; rf power density was approximately 0.1 W/cm$^2$; the relative gas flow rates were adjusted according to the desired concentration of alloy in each film. Alloys of 0.25-30% (gas-phase ratio) were prepared.

SIMS depth-profile analyses of the alloy films confirmed that the films contained only trace amounts (less than 0.4 at. %) of carbon and oxygen contaminants. (The spectra, not shown here, were similar to that shown in FIG. 3.) Film thicknesses as determined from the SIMS spectrum agreed with thickness data obtained using a profilometer.

Figure 12:
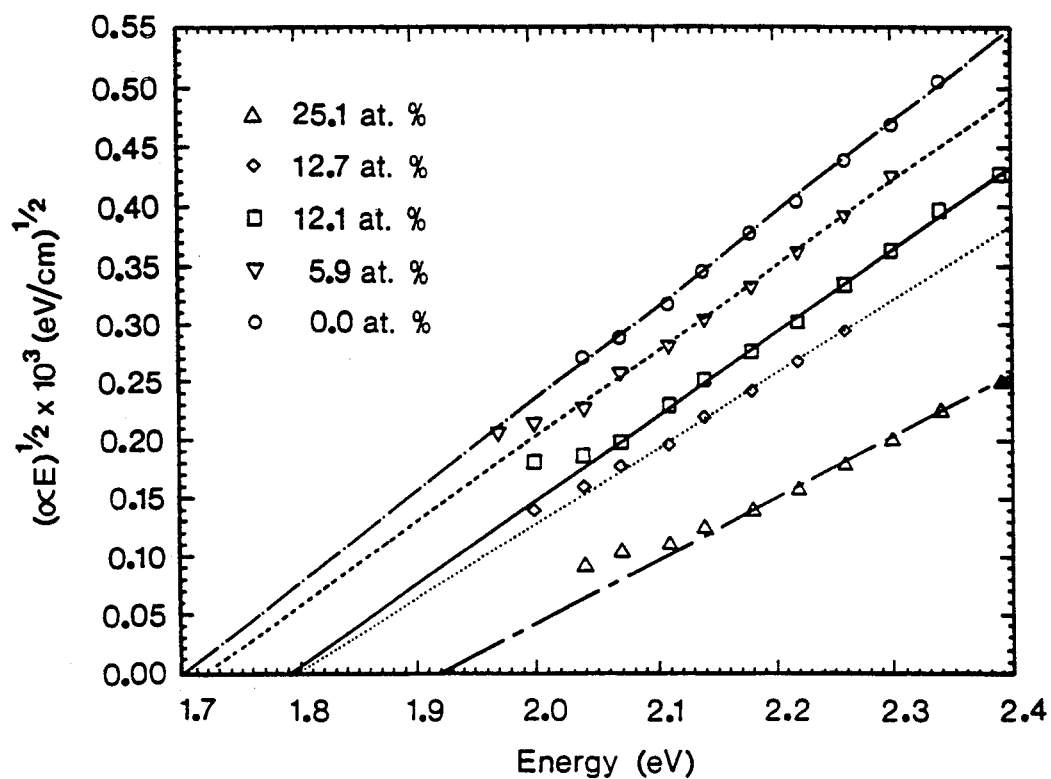
FIG. 12 shows Tauc plots for various compositions of hydrogenated amorphous silicon-sulfur alloys according to the present invention.

Tauc plots for different a-Si:S:H alloys are shown in FIG. 12. Sulfur composition was varied over the range 0 to 25 % (S/S+Si; gas-phase ratio). We noted a tendency for the plots to shift to higher energy values with increasing sulfur content in the films, accompanied by a decrease in the slope from 790 to 510.

The variation of optical bandgap energy as a function of composition for the a-Si:S:H alloys exhibited a profile similar to that shown in FIG. 12 for this alloy. The bandgap increased from 1.70 eV for pure a-Si:H to 1.92 eV for a film containing 25.1 at. % sulfur. Similarly, the optical bandgap of a-Si:H was increased by alloying with selenium, similar to the data shown in FIG. 12 for this alloy.

We believe that the change in the optical bandgap, exhibited upon alloying amorphous silicon with sulfur or selenium, is related to the energy of the bond formed between silicon and the alloying element. i.e., the optical bandgap is proportional to the strength of the bond between a silicon atom and an atom of the alloying element.

EXAMPLE 5

In this example, amorphous silicon-selenium and silicon-sulfur films were produced by PECVD, with and without hydrogen dilution, to evaluate the effect of hydrogen dilution on film quality. The alloy films were produced in an rf-coupled reactor as described hereinabove. The base pressure of the reaction chamber prior to introducing reactant gas was less than $10^{-7}$ Torr. The rf power supply was operated at 13.6 MHz. The spacing between the two rf electrodes was 1.4 cm. Typical rf power density during film deposition was 0.10 W/cm$^2$. The typical substrate temperature during film deposition ranged from 230 to 350° C. The gas pressure in the reaction chamber during film deposition ranged from 650 mTorr to 1,200 mTorr.

As observed previously, the elemental composition of the alloying elements, Se and S, in the alloy films increased with increasing flow-rate ratio of alloying gas to silane. An almost linear relationship was observed.

Alloying amorphous silicon with either sulfur or selenium produced wider bandgap semiconductor materials, wherein the optical bandgap increased with increasing concentration of the alloying element in the film. An almost linear relationship between the optical bandgap and the concentration of selenium or sulfur was observed. For example, the optical bandgap energy $E_g$ increased from 1.74 eV for an amorphous silicon film to 1.87 eV for an alloy film containing 12 at. % selenium.

Figure 13:
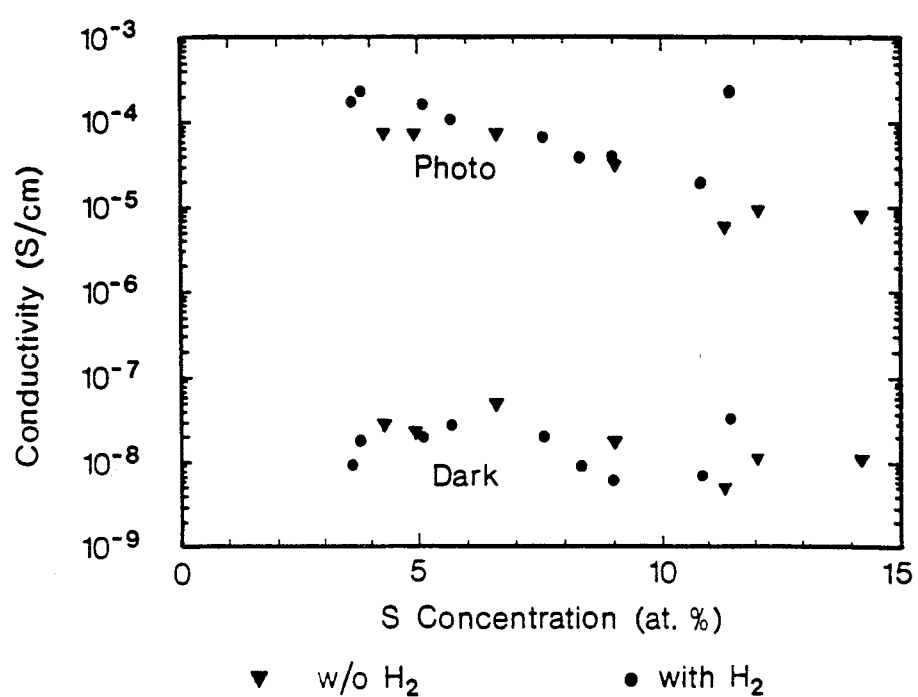
FIG. 13 comprises plots of light and dark conductivities as a function of sulfur concentration in amorphous silicon-sulfur alloys, deposited with and without hydrogen dilution, according to the present invention.

Conductivities of sulfur alloy films in both the light and the dark, deposited with or without hydrogen dilution, are shown in FIG. 13. With each alloy film, the dark conductivity remained constant within errors of measurement, namely about $10^{-8}$ S/cm. The dark conductivity was independent of film composition, whether hydrogen-diluted or not. On the other hand, photoconductivities of alloy films deposited with hydrogen dilution were greater than photoconductivities of corresponding alloy films deposited without hydrogen dilution. A very high photoconductivity, $3 \times 10^{-4}$ S/cm, was observed with a hydrogenated alloy film containing 11.5 at. % sulfur. This conductivity is close to the photoconductivity of an amorphous silicon film. In films prepared without hydrogen dilution, the photoconductivity actually decreased as the sulfur concentration increased. Thus, on the basis of photoconductivity, alloys of amorphous silicon and sulfur prepared with hydrogen dilution are superior to corresponding alloys prepared without hydrogen dilution.

It was also observed that the light-to-dark conductivity ratio varied with changing deposition parameters. The best films were obtained by depositing at 340° C. at a gas pressure of 660 mTorr.

FIG. 14 is a plot of the light-to-dark conductivity ratio versus the optical energy bandgap of amorphous silicon-selenium alloy films deposited with and without hydrogen dilution. Alloy films deposited with hydrogen dilution exhibited conductivity ratios ranging from about $10^3$ to about $10^5$. These figures are indicative of excellent film quality, wherein "device quality" films preferably have a light-to-dark conductivity ratio of about $10^4$ or better. As shown in FIG. 14, the light-to-dark conductivity ratios of alloy films prepared with hydrogen dilution were generally one order of magnitude higher than ratios of corresponding alloy films prepared without hydrogen dilution. Thus, on the basis of photoresponse, hydrogen dilution yielded better amorphous alloy films.

The sub-bandgap photoresponse spectra of the alloy films were also investigated. The spectra obtained, similar to FIG. 9, revealed a much smaller exponential portion for films prepared with hydrogen dilution. Thus, we concluded that the structural defects were lessened by depositing the films in a hydrogen environment.

The combination of higher photoconductivity, greater light-to-dark conductivity ratio, and fewer structural defects observed with films deposited with hydrogen dilution indicate that the film quality of the amorphous silicon-selenium and amorphous silicon-sulfur alloys prepared with hydrogen dilution were improved relative to alloys deposited without hydrogen dilution.

We believe that hydrogen dilution during alloy deposition in the rf plasma forms hydrogen ions that selectively etch weakly-bonded atoms. We noted that this selective etching of hydrogen ions during film growth actually reduces film deposition rate. FIG. 15 shows the light-to-dark conductivity ratio as a function of the deposition rate of amorphous silicon-sulfur alloy films. As can be seen, all the deposition rates with hydrogen dilution were lower than deposition rates without hydrogen dilution, with all other deposition parameters being constant. It can also be seen that a lower deposition rate yields a higher light-to-dark conductivity ratio, which indicates better film quality.

Figure 16:
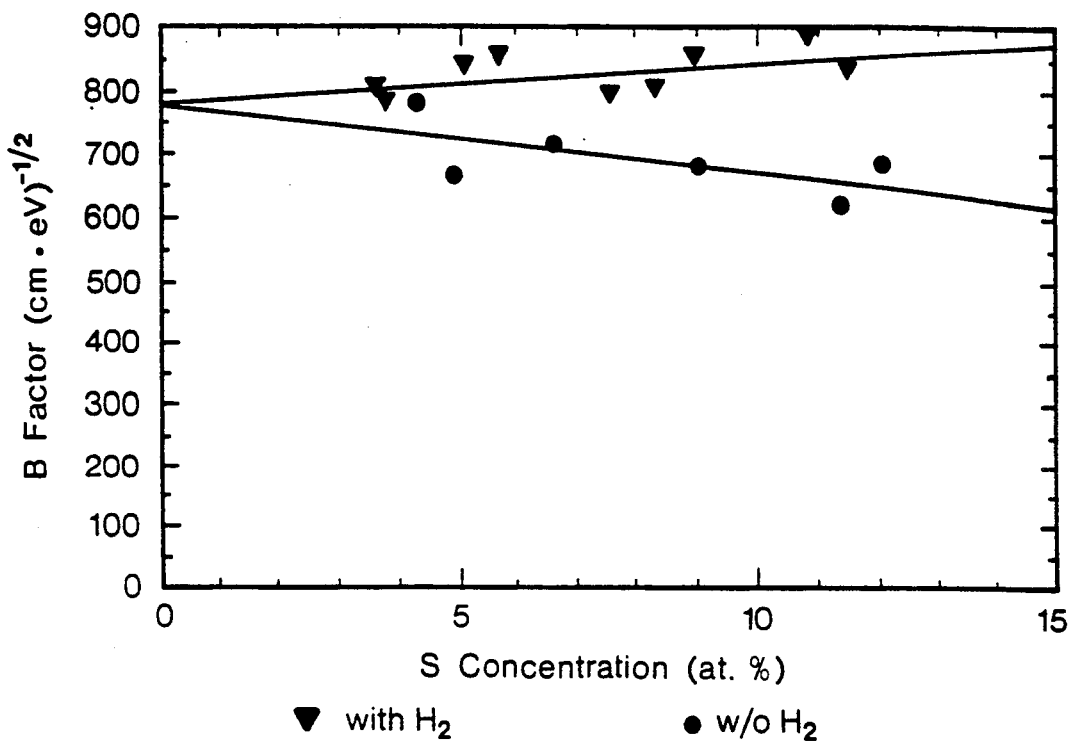
FIG. 16 comprises plots of the "B factor" as a function of sulfur concentration in amorphous silicon-sulfur alloys, deposited with and without hydrogen dilution, according to the present invention.

We also believe that hydrogen dilution yields a denser amorphous atomic network. One way of evaluating this is by examining the relationship of the "B factor" with the concentration of the alloying element. (The "B factor" is a measure of photo absorption of the amorphous silicon alloy materials. The B factor is determined from the Tauc formula: $(\alpha E) = B[E-Eg]^{\frac{1}{2}}$, wherein $\alpha$ is the absorption coefficient of the alloy, E is the photon energy, and Eg is the optical bandgap energy.) FIG. 16 is a plot of B factor values versus sulfur concentration in hydrogenated and non-hydrogenated alloy films. A larger B factor value indicates a larger absorption coefficient of the alloy, which indicates a denser atomic network. We found that all films deposited with hydrogen dilution had greater B factor values than films deposited without hydrogen dilution. We also found that the B factor value generally decreased as the sulfur concentration increased in films prepared without hydrogen dilution. In contrast, with sulfur alloy films prepared in a hydrogen-rich environment, a higher sulfur concentration in the film yielded a greater B factor value. Therefore, hydrogenation of the alloy films according to the present invention yielded denser alloys.

Figure 17:
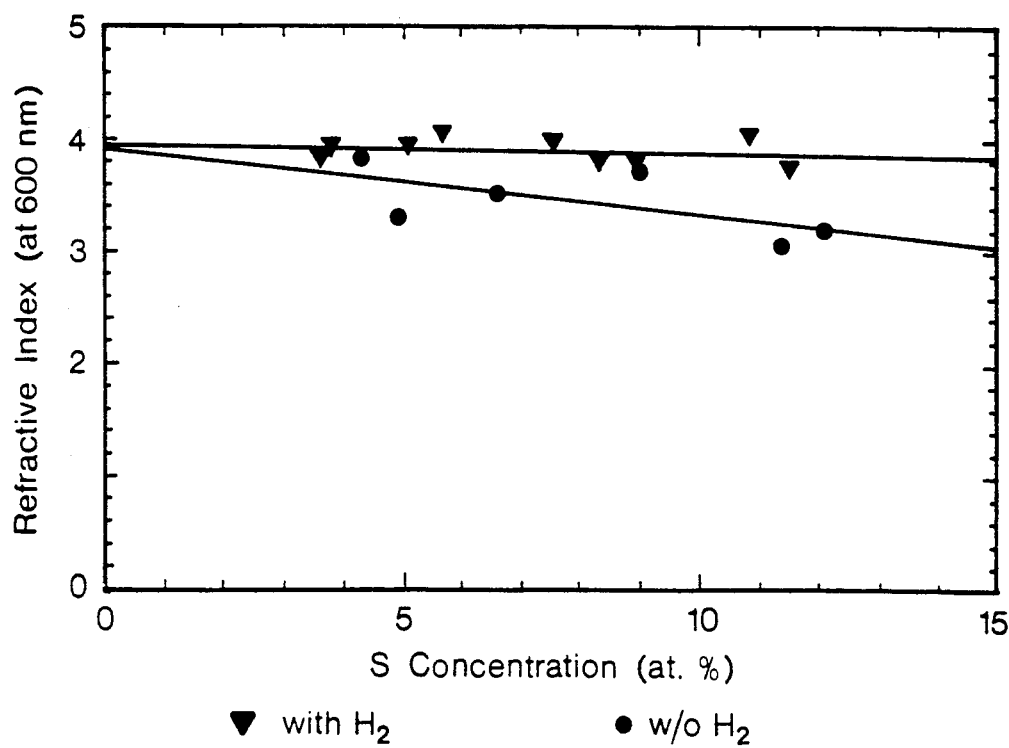
FIG. 17 comprises plots of the refractive index at 600 nm as a function of sulfur concentration for amorphous silicon-sulfur alloys, deposited with and without hydrogen dilution, according to the present invention.

Another way of evaluating film density is by determining the refractive index of the alloy film. FIG. 17 shows the index (at 600 nm) of various hydrogenated and non-hydrogenated alloy films as a function of sulfur concentration. The refractive indices of films deposited with hydrogen dilution were greater than the refractive indices of films deposited without hydrogen dilution. In fact, the refractive indices of films prepared with hydrogen dilution were almost constant, with a value about 4 $(cm \cdot eV)^{\frac{1}{2}}$. Films prepared without hydrogen dilution exhibited a decreasing refractive index as the sulfur content increased.

Figure 18:
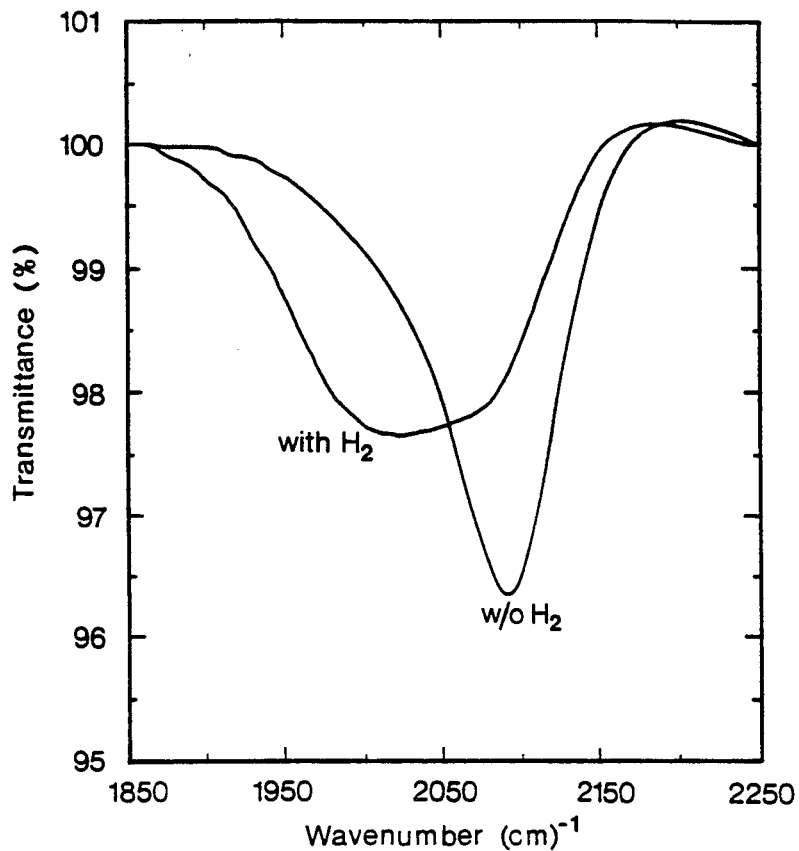
FIG. 18 shows representative FTIR transmittance spectra for amorphous silicon-selenium alloys, deposited with and without hydrogen dilution, according to the present invention.

Hydrogen dilution also apparently affected the way in which hydrogen became bonded in the amorphous alloy. FIG. 18 shows FTIR transmittance spectra for amorphous silicon-selenium alloy films deposited with and without hydrogen dilution. As can be seen, the position of the main absorption peak was shifted by hydrogen dilution. We interpreted these data as indicating that, in alloy films prepared with hydrogen dilution, more than 90% of the hydrogen was in the Si—H bond form. In alloys prepared without hydrogen dilution, less than 25% of the hydrogen was in the Si—H bond form; 75% of the hydrogen is in the Si—H$_2$ bond form. We believe that this shift was caused by selective etching by hydrogen ions during film deposition.

The two films evaluated in FIG. 18 had similar hydrogen content (about 5.5%). This concentration of hydrogen is lower than that of hydrogenated amorphous silicon which usually has a hydrogen content of about 10%. In hydrogenated amorphous silicon, hydrogen atoms are believed to be mainly involved in termination of dangling bonds. The lower concentration of hydrogen in alloy films according to the present invention indicates that some of the hydrogen atoms normally present in hydrogenated amorphous silicon are partially replaced in these alloys by alloying atoms. Since ESR experiments showed that the dangling bond density of the alloys was almost constant even with an increasing concentration of sulfur or selenium (data not shown), it is reasonable to conclude that selenium and sulfur atoms are effective dangling-bond terminators.

EXAMPLE 6

Amorphous silicon-selenium alloys were prepared by PECVD on Corning 7059 glass substrates, as described above, with and without hydrogen dilution. Silane gas flow into the reactor was at 108 sccm and hydrogen gas flow was at 13.5 sccm. We prepared alloys with two different selenium concentrations: a first alloy containing 5.0 at. % Se and a second alloy containing 7.2 at. % Se. A material with zero selenium was used as a control. Two aluminum electrodes were vacuum-evaporated onto each film to facilitate electrical contact. The electrodes were spaced about 4.5 mm apart. For conductivity measurements, a 27-volt potential was applied across the electrodes. The films were exposed to 100 mW/cm$^2$ (equal to one sun) white light illumination. During prolonged exposure to the light, the conductivity of the films was monitored continuously as described above.

Figure 19:
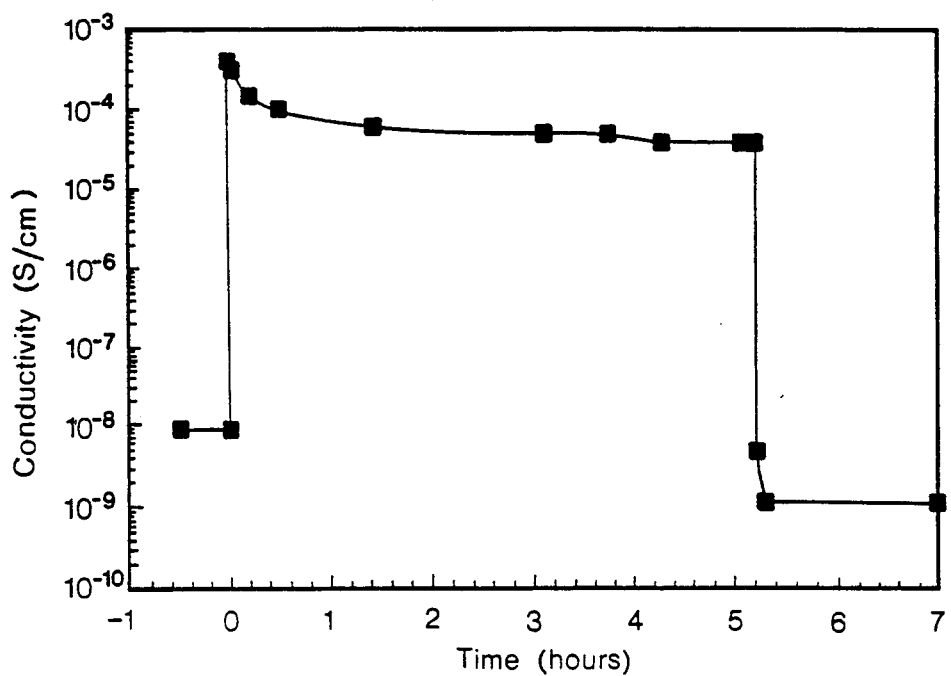
FIG. 19 is a plot showing a decrease in conductivity upon prolonged illumination of a representative prior-art amorphous silicon film.
Figure 20:
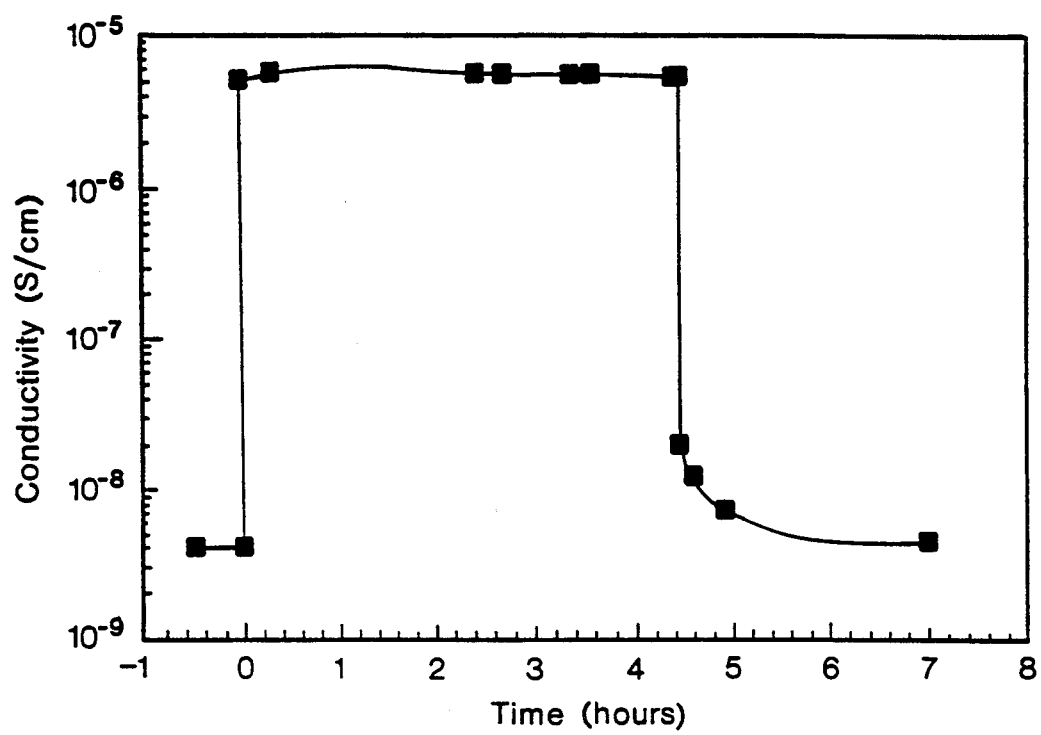
FIG. 20 is a conductivity profile of a hydrogenated amorphous silicon-selenium alloy according to the present invention when illuminated for a long time.
Figure 21:
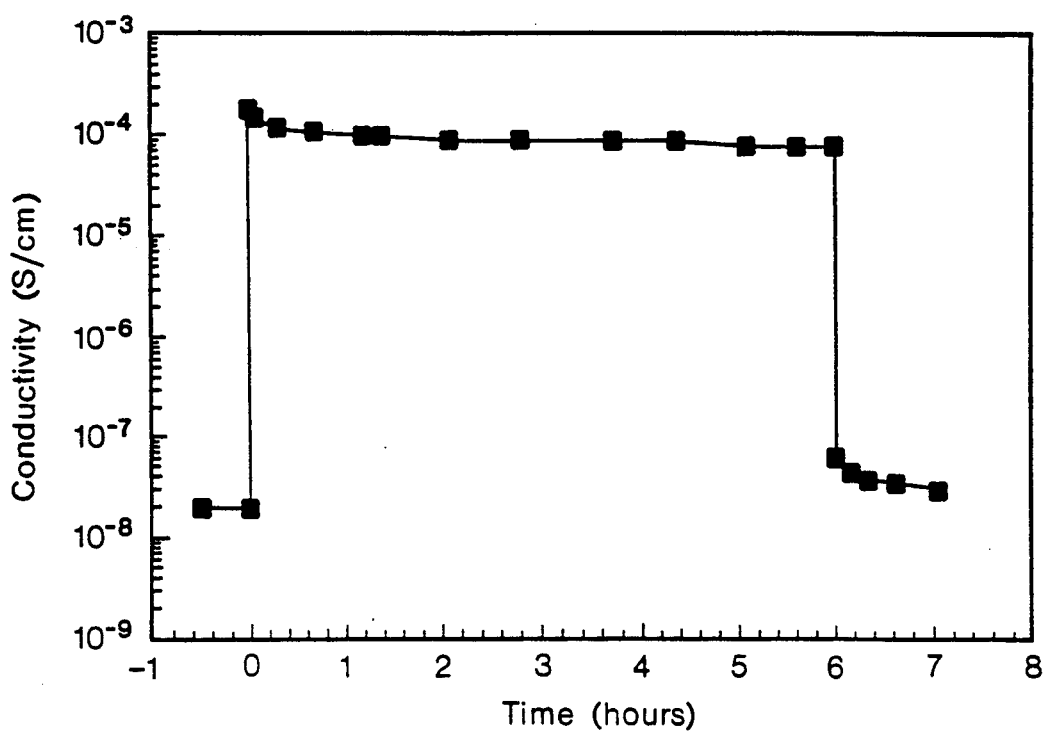
FIG. 21 is another plot similar to FIG. 20.

FIG. 19 shows a representative conductivity profile of amorphous silicon film. Illumination was begun at zero hours and continued for five hours. As can be seen, this film experienced a tenfold decrease in photoconductivity (Staebler-Wronski degradation) during illumination. The hydrogenated amorphous silicon-selenium alloy film, in contrast, exhibited substantially no Staebler-Wronski degradation, as shown in FIGS. 20 and 21. We also found that amorphous silicon-selenium films prepared without hydrogen dilution exhibited very little Staebler-Wronski degradation (data not shown).

EXAMPLE 7

This example comprises further examinations of the quality of amorphous silicon-selenium alloy films according to the present invention, prepared with and without hydrogen dilution. The films of Example 5 were evaluated by Small-Angle X-ray Spectroscopy (SAXS).

Figure 22:
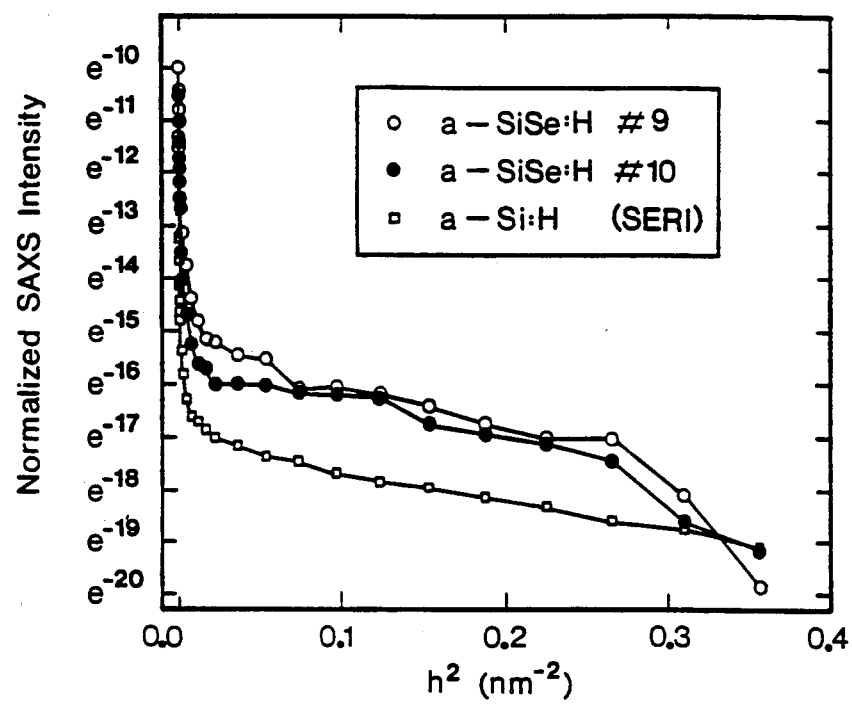
FIG. 22 comprises plots of normalized small-angle X-ray spectroscopy intensity data for two hydrogenated amorphous silicon-selenium alloys according to the present invention, contrasted with similar data for a representative prior-art hydrogenated amorphous silicon material.

Plots of data from the SAXS study are shown in FIG. 22. The ordinate is SAXS X-ray scattering intensity, which is given in normalized exponential units. The abscissa is given in h$^2$ units which are a measure of wave vector which, in turn, is a measure of the incident angle of the X-ray beam. From these data, the void fraction can be calculated as described in Williamson et al., *J. Non-cryst. Solids* 114:226 (1989); Mahan et al., *Solar Cells* 27:465 (1989); and Mahan et al., *Phys. Rev. B* 40:12024 (1989). As can be seen, two of the a-Si:Se:H alloys according to the present invention (circles) exhibited void fractions of 2.7% and 1.7%. These void fractions are very close to the void fraction of a high-quality a-Si:H (1.06%).

Figure 23:
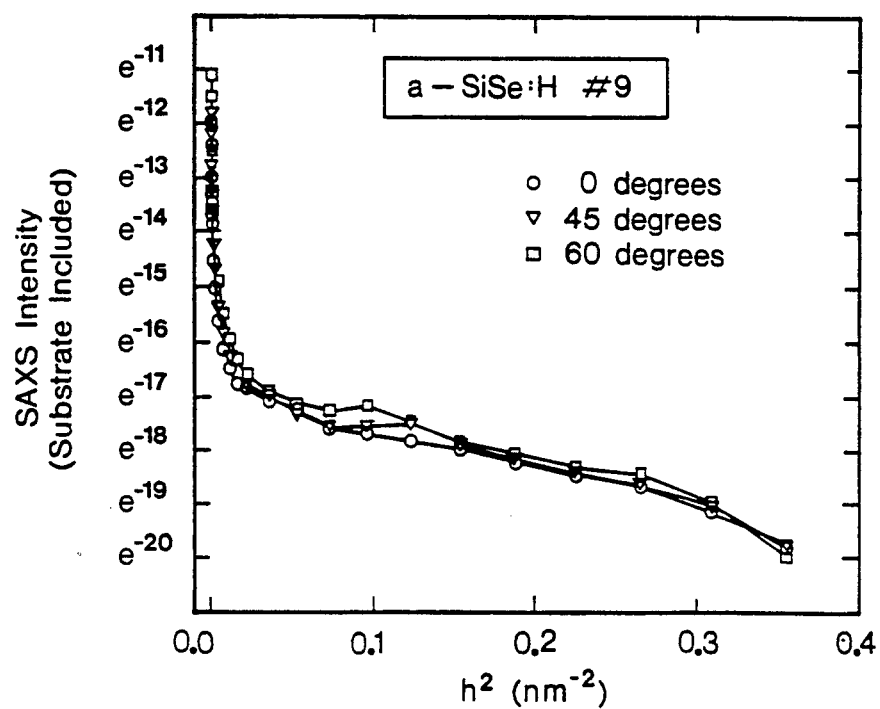
FIG. 23 is a plot of small-angle X-ray spectroscopy intensity data for one of the a-Si:Se:H alloys of FIG. 22 at various degrees of orientation.

The a-Si:Se:H film of FIG. 22, having a void fraction of 2.7%, was examined by SAXS at tilt angles of zero, 45, and 60° to evaluate the orientation of the microvoids in the alloy. Results are plotted in FIG. 23 wherein it can be seen that all three plots are substantially coincident. These results indicate very little tilting effect: the microvoids are either spherical or, if non-spherical, are randomly oriented.

Figure 24:
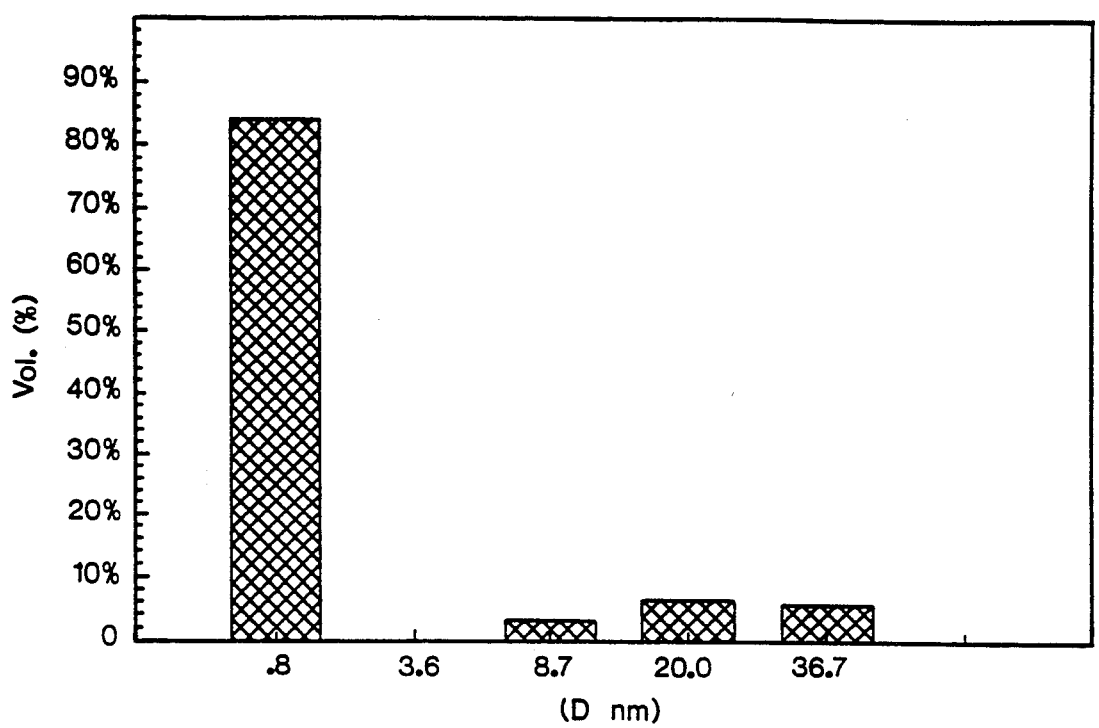
FIGS. 24 and 25 are histograms of the size distribution of microvoids in hydrogenated amorphous silicon-selenium alloys according to the present invention.
Figure 25:
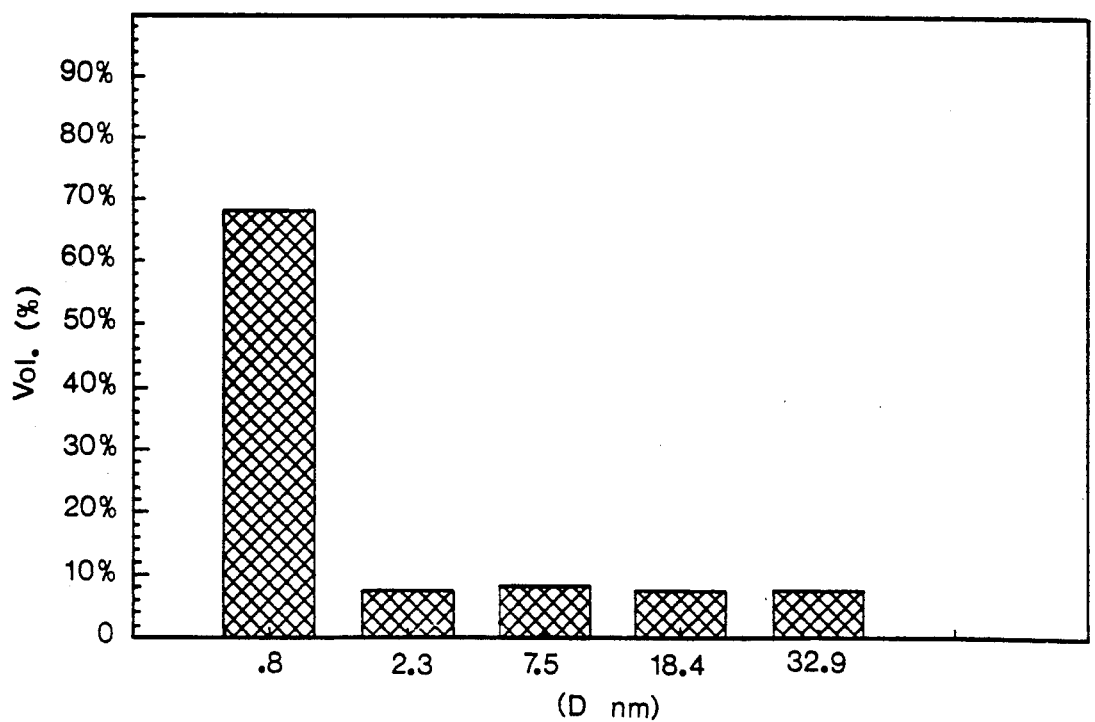

Size distributions of microvoids in the two a-Si:Se:H alloy films of FIG. 22 were also determined. As shown in FIGS. 24 and 25, it can be seen that most of the microvoids were in the 8 to 9 Å range.

Thus, the film-defect profile of amorphous silicon alloys according to the present invention is not substantially different from amorphous silicon as known in the prior art. Also, defects appear to be extremely small and not oriented in any way that would materially degrade film quality.

While the invention has been described in connection with a detailed description and numerous examples, it will be understood that the invention is not limited to the description and examples. On the contrary, it is intended to cover all alternatives, modifications, and equivalents as may be included within the spirit and scope of the invention as defined by the appended claims.

We claim:

1. A composition of matter comprising:
   a solid-state alloy comprising amorphous silicon, hydrogen, and an alloying element selected from a group consisting of sulfur, selenium, and tellurium, the alloy having a photoconductivity that exhibits a change of less than one order of magnitude after the alloy is illuminated with white light for six hours at 100 mW/cm$^2$.

2. An alloy as recited in claim 1 layered on a solid-state substrate.

3. A photovoltaic cell comprised of an alloy as recited in claim 1.

4. A photovoltaic cell comprised of a p-doped semiconductor layer, an n-doped semiconductor layer, and an intrinsic layer, wherein at least one of said layers comprises an alloy as recited in claim 1.

5. A composition of matter as recited in claim 1 having a light-to-dark conductivity ratio of no less than 10$^2$.

6. A composition of matter as recite din claim 1 having a concentration of hydrogen of no greater than about 10 at. %.

7. A composition of matter as recited in claim 1 wherein at least 90 percent of the hydrogen present in the alloy is in a Si-H bond form.

8. A composition of matter as recited in claim 1 further comprising an n-type dopant.

9. A composition of matter as recited in claim 1 further comprising a p-type dopant.

10. A composition of matter as recited in claim 1 exhibiting a B factor increase as the concentration of the alloying element is increased in the alloy.

11. A composition of matter as recited in claim 1 exhibiting a substantially constant refractive index as the concentration of the alloying element is increased in the alloy.

12. A composition of matter as recited in claim 1 exhibiting a void fraction of no greater than about three percent.

13. A solid-state composition of matter for use in photovoltaic cells, comprising a homogeneous alloy of hydrogenated amorphous silicon and an alloying element selected from a group consisting of sulfur, selenium, and tellurium, the alloy having (a) a photoconductivity that exhibits a change of less than one order of magnitude after the alloy is illuminated with white light for six hours at 100 mW/cm$^2$; (b) a light-to-dark conductivity ratio of not less than 10$^2$; and (c) a void fraction of less than three percent.

14. A material as recited in claim 13 having an optical bandgap energy within a range of about 1.0 to about 2.3 eV.

15. A composition of matter as recited in claim 13 wherein the alloying element is present in the alloy at a concentration of up to about 30 at. %.

16. A composition of matter as recited in claim 5 layered on a solid-state substrate.

17. A photovoltaic cell comprised of a material as recited in claim 13.

18. A solid-state material for use in photovoltaic cells, comprising an alloy of amorphous silicon, hydrogen, and an alloying element selected from a group consisting of sulfur, selenium, and tellurium, the material having (a) a photoconductivity that exhibits a change of less than one order of magnitude after the material is illuminated with white light for six hours at 100 mW/cm$^2$; (b) a light-to-dark conductivity ratio of not less than 10$^2$; (c) a concentration of hydrogen of less than 10 at. %; and (d) at least 90 percent of the hydrogen in an Si—H bond form.

19. A material as recited in claim 18 layered on a solid-state substrate selected from a group consisting of silicon, glass, quartz, and titanium.

20. A photovoltaic cell comprised of a material as recited in claim 18.

21. A method for preparing a solid-state material for use in photovoltaic cells, comprising the steps of:
   (a) providing a solid-state substrate;
   (b) providing reactive gases individually comprising silane gas, hydrogen gas, and an alloying gas selected from a group consisting of H$_2$M compounds wherein M is an element from a group consisting of sulfur, selenium, and tellurium;
   (c) providing an energy source sufficient to cause the reactive gases to react with each other and form a solid-state alloy of silicon, hydrogen, and M on the substrate; and
   (d) introducing the reactive gases to the energy source and the substrate so as to cause the reactive gases to react and form, on the substrate, a hydrogenated amorphous alloy of silicon and M, thereby forming a solid-state semiconductor material for use in photovoltaic cells.

22. A method as recited in claim 21 wherein the energy source comprises an rf plasma.

23. A method as recited in claim 21 wherein the energy source further comprises heat applied to the substrate.

24. A method as recited in claim 23 wherein the substrate is heated to a temperature within a range of about 230° C. to about 360° C.

25. A method as recited in claim 24 wherein the substrate is heated at a subatmospheric pressure of about 230 mTorr to about 1800 mTorr.

26. A method as recited in claim 21 wherein, in step (d), the alloy of hydrogenated amorphous silicon and M is formed on the surface of the substrate at a rate no greater than about 1 Å/s.

27. A solid-state semiconductor material prepared by a method as recited in claim 21.

* * * * *

UNITED STATES PATENT AND TRADEMARK OFFICE
CERTIFICATE OF CORRECTION

PATENT NO. : 5,242,505
DATED : September 7, 1993
INVENTOR(S) : Lin et al.

It is certified that error appears in the above-identified patent and that said Letters Patent is hereby corrected as shown below:

Column 17, line 26, "$(\alpha E)=B[E-Eg^{\frac{1}{2}}$" should be --$(\alpha E)=B[E-Eg]^{\frac{1}{2}}$--;

Column 17, line 47, "the index" should be --the refractive index--;

Column 17, line 54, "$(cm \cdot eV)^{\frac{1}{2}}$" should be --$(cm \cdot eV)^{-\frac{1}{2}}$--; and Column 19, line 47, "recite din" should be --recited in--.

Signed and Sealed this

Tenth Day of May, 1994

Attest:

BRUCE LEHMAN

Attesting Officer    Commissioner of Patents and Trademarks